(12) United States Patent
Bruneau et al.

(10) Patent No.: US 12,231,024 B2
(45) Date of Patent: Feb. 18, 2025

(54) DRIVE UNIT FOR ELECTRIC VEHICLE

(71) Applicant: Taiga Motors Inc., Lasalle (CA)

(72) Inventors: Samuel Bruneau, Montreal (CA); Paul Bruneau, Montreal (CA); Gabriel Bernatchez, Montreal (CA)

(73) Assignee: Taiga Motors Inc., Lasalle (CA)

( * ) Notice: Subject to any disclaimer, the term of this patent is extended or adjusted under 35 U.S.C. 154(b) by 627 days.

(21) Appl. No.: 17/569,888

(22) Filed: Jan. 6, 2022

(65) Prior Publication Data

US 2022/0219786 A1 Jul. 14, 2022

Related U.S. Application Data

(60) Provisional application No. 63/135,466, filed on Jan. 8, 2021, provisional application No. 63/135,474, filed on Jan. 8, 2021.

(51) Int. Cl.
*H02K 9/19* (2006.01)
*B60K 1/00* (2006.01)
(Continued)

(52) U.S. Cl.
CPC .............. *H02K 9/19* (2013.01); *H02K 5/203* (2021.01); *H02K 9/00* (2013.01); *H02K 9/22* (2013.01); *H02K 9/227* (2021.01); *H02K 11/33* (2016.01); *H02P 27/06* (2013.01); *B60K 1/00* (2013.01); *B60K 2001/006* (2013.01); *B60K 1/04* (2013.01); *B60L 15/20* (2013.01);
(Continued)

(58) Field of Classification Search
CPC ...... G05B 15/02; G05B 19/042; G05B 19/05; H02M 1/32; H02M 1/0009; H02M 7/5387; H02M 3/155; H02M 3/157; H02K 11/33; H02K 11/21; F03D 9/25; B60T 13/74; F01P 7/16; F01P 3/20
See application file for complete search history.

(56) References Cited

U.S. PATENT DOCUMENTS 6,181,590 B1  1/2001  Yamane et al.
9,000,631 B2  4/2015  Prix
(Continued)

FOREIGN PATENT DOCUMENTS

CN  206472074  9/2017
CN  207074936  3/2018
(Continued)

*Primary Examiner* — Antony M Paul
(74) *Attorney, Agent, or Firm* — Dicke, Billig & Czaja, PLLC

(57) ABSTRACT

Drive units for electric vehicles are provided. One example provides a power inverter of an electric drive unit. The power inverter comprises a housing with a compartment at least partially formed by a first wall and an opposing second wall. The power inverter also comprises a plurality of electrical switches to convert direct current (DC) power into alternating current (AC) power, the plurality of electrical switches coupled to the first wall within the compartment. The power inverter further comprises a power controller to control the plurality of electrical switches, the power controller coupled to the plurality of electrical switches. The power inverter also comprises a motor controller to control the power controller, the motor controller disposed between the power controller and the second wall.

23 Claims, 26 Drawing Sheets

(51) Int. Cl.
  *B60K 1/04*       (2019.01)
  *B60L 15/20*      (2006.01)
  *B60W 10/08*      (2006.01)
  *B62M 27/02*      (2006.01)
  *H02K 5/20*       (2006.01)
  *H02K 5/22*       (2006.01)
  *H02K 9/00*       (2006.01)
  *H02K 9/22*       (2006.01)
  *H02K 11/00*      (2016.01)
  *H02K 11/33*      (2016.01)
  *H02K 16/02*      (2006.01)
  *H02P 27/06*      (2006.01)

(52) U.S. Cl.
  CPC ............. *B60W 10/08* (2013.01); *B62M 27/02* (2013.01); *H02K 5/225* (2013.01); *H02K 11/0094* (2013.01); *H02K 16/02* (2013.01)

(56) References Cited

U.S. PATENT DOCUMENTS

| | | |
|---|---|---|
| 10,362,701 B2 | 7/2019 | Sakai |
| 2001/0012212 A1 | 8/2001 | Ikeda |
| 2009/0040724 A1 | 2/2009 | Nishikimi et al. |
| 2010/0013331 A1 | 1/2010 | Yoshida et al. |
| 2011/0211980 A1 | 9/2011 | Shibuya et al. |
| 2011/0261588 A1 | 10/2011 | Hattori et al. |
| 2012/0250384 A1 | 10/2012 | Ito et al. |
| 2015/0199376 A1 | 7/2015 | Matsuo |
| 2016/0157391 A1 | 6/2016 | Huang et al. |
| 2017/0294821 A1 | 10/2017 | Shimizu et al. |
| 2018/0159403 A1 | 6/2018 | Yokoyama et al. |
| 2018/0287452 A1 | 10/2018 | Kim et al. |
| 2019/0199160 A1 | 6/2019 | Okuhata et al. |
| 2020/0140037 A1 | 5/2020 | Haavikko et al. |
| 2020/0212755 A1 | 7/2020 | Okuhata et al. |
| 2020/0280238 A1 | 9/2020 | Zhu et al. |
| 2020/0290451 A1 | 9/2020 | Van Seventer |
| 2020/0313504 A1* | 10/2020 | Okochi ............... F04C 29/0085 |
| 2021/0257883 A1 | 8/2021 | Kim et al. |
| 2022/0009589 A1 | 1/2022 | Matsushita |
| 2022/0017181 A1 | 1/2022 | Suzuki et al. |
| 2022/0063764 A1 | 3/2022 | Matsushita |
| 2022/0111929 A1 | 4/2022 | Matsushita |

FOREIGN PATENT DOCUMENTS

| | | |
|---|---|---|
| DE | 10 2019 207 445 | 11/2020 |
| JP | 2012-210000 | 10/2012 |
| JP | 5889643 | 3/2016 |
| JP | 6365209 | 8/2018 |
| KR | 102010301 | 8/2019 |
| WO | 2021/084520 | 5/2021 |

\* cited by examiner

DRIVE UNIT FOR ELECTRIC VEHICLE

CROSS-REFERENCE TO RELATED APPLICATIONS

This application claims priority from U.S. Provisional Patent Application No. 63/135,466, filed Jan. 8, 2021, and U.S. Provisional Patent Application No. 63/135,474, filed Jan. 8, 2021, which are incorporated by reference in their entirety herein.

TECHNICAL FIELD

The present disclosure relates generally to electric vehicles and, in particular embodiments, to powertrain components of electric vehicles.

BACKGROUND

Electric powertrains of electric vehicles, including electric powersport vehicles (e.g., all-terrain vehicles (ATVs), personal watercraft (PWC), and snowmobiles), typically include a battery system, one or more electrical motors, each with a corresponding electronic power inverter (sometimes referred to as a motor controller), and various auxiliary systems (e.g., cooling systems). Efficiencies in size, weight, and energy consumption of system components improve vehicle performance (e.g., responsiveness, range, and reliability) and cost, particularly for electric powersport vehicles where space and weight are at a premium.

SUMMARY

Some embodiments of the present disclosure relate to drive units with efficiencies and power densities that are suitable for use in electric powersport vehicles. Such drive units may provide, inter alia, high efficiencies at maximum power and/or compact configurations of a rotor, stator and/or power inverter.

One example provides a drive unit for an electric vehicle comprising a drive unit housing defining a form factor having a volume of less than 27,000 cm$^3$, an electric motor comprising a rotor, a stator and a rotor shaft, and an electric inverter in electrical communication with the electric motor. Both the electric motor and the electric inverter may be housed within the drive unit housing and the drive unit may provide a continuous power density of greater than 5 kW/kg. The electric vehicle may be an off-road powersport vehicle.

In some examples, the electric motor comprises a hub between the rotor shaft and a rotor laminate. The hub may comprise a less dense material than the rotor laminate. Optionally, the rotor comprises an inner diameter of greater than 90 mm and an outer diameter of less than 170 mm.

In some examples, a combination of the drive unit housing, electric motor and electric inverter have a combined weight of less than 30 kg.

In some examples, flux weakening of the drive unit occurs at a motor shaft speed of greater than 75% of a rated speed.

In some examples, the maximum power is provided at greater than 80% of a rated speed.

In some examples, the drive unit provides a torque density of greater than 7.5 Nm/kg.

In some examples, the rotor comprises magnets positioned in a V-shape. The magnets may define 8 poles and the stator may comprise 48 slots. Optionally, each magnet comprises a volume greater than 7000 mm$^3$. The stator may comprise symmetric windings with four parallel coils, with three turns per coil. Alternatively or additionally, the rotor defines a rotor skew between at least two rotor slices. For example, the rotor may define a rotor skew between 3 slices with a 2-4 degree shift between slices. In some examples, the magnets may define 10 poles and the stator may comprise 66 slots.

In some examples, the drive unit housing defines a first compartment for the electric motor and a second compartment for the electric inverter, the first and second compartments being separated by a shared wall. The first compartment and second compartment may be positioned adjacent each other along a longitudinal axis of the form factor. Cooling passages may be present in the shared wall separating the electric motor and the electric inverter.

One example provides a snowmobile comprising an electric motor comprising a rotor and a stator, an electric inverter in electrical communication with the electric motor, and a drive unit housing in which both the electric motor and electric inverter are disposed. A combination of the electric motor, electric inverter and drive unit housing may weigh less than 30 kg and the drive unit provides a power density of greater than 5 kW/kg.

One example provides a power inverter of an electric drive unit, the power inverter comprising: a housing comprising a compartment at least partially formed by a first wall and an opposing second wall; a plurality of electrical switches to convert direct current (DC) power into alternating current (AC) power, the plurality of electrical switches coupled to the first wall within the compartment; a power controller to control the plurality of electrical switches, the power controller coupled to the plurality of electrical switches; and a motor controller to control the power controller, the motor controller disposed between the power controller and the second wall.

In some examples, the power controller is disposed between the plurality of electrical switches and the motor controller.

In some examples, the motor controller is secured to the second wall. Optionally, a plate is disposed between the power controller and the motor controller, the plate being coupled to the second wall to secure the motor controller to the second wall. The plate may be coupled to the second wall via fasteners. For example, the fasteners may comprise bolts, the second wall may comprise through-holes to receive the bolts, and the plate may comprise threaded openings to couple to the bolts. The plate may be electrically grounded to electrically shield the motor controller.

In some examples, the first wall, the plurality of switches, the power controller, the motor controller and the second wall are arranged in a stack along a longitudinal axis of the housing. A capacitor may be disposed in the compartment. The capacitor may have a first length along the longitudinal axis of the housing, the stack may have a second length along the longitudinal axis of the housing, and the second length may be less than or substantially equal to the first length.

In some examples, the power controller comprises a first circuit board and the motor controller comprises a second circuit board.

In some examples, the first wall comprises a fluid chamber to cool the plurality of electrical switches.

In some examples, the second wall is a removeable cover of the housing.

In some examples, the plurality of electric switches convert the DC power into three-phase AC power.

In some examples, the power inverter comprises an electrical connector to connect to the motor controller to carry control signals to the motor controller. The electric drive unit may be implemented in an electric vehicle and the electrical connector may carry throttle signals to the motor controller.

In some examples, a cable is connected between the power controller and the motor controller to provide communication between the power controller and the motor controller.

In some examples, the first wall is a shared wall separating the compartment from an electric motor of the drive unit.

One example provides a power inverter of an electric drive unit, the power inverter comprising: a housing comprising a compartment at least partially formed by a first wall and an opposing second wall, the compartment having a first portion, a second portion and a third portion, the second portion being adjacent to the first portion and to the third portion; at least one capacitor connected between positive and negative leads of a direct current (DC) power supply, the at least one capacitor disposed within the first portion of the compartment; a plurality of electrical switches disposed within the second portion of the compartment, the plurality of electrical switches connected to the positive and negative leads of the DC power supply to convert DC power to AC power; and a plurality of terminals connected to the plurality of electrical switches to transfer the AC power to an electric motor of the electric drive unit, the plurality of terminals disposed within the third portion of the housing.

In some examples, the second portion is disposed between the first portion and the second portion. Optionally, the first portion, the second portion and the third portion of the compartment are arranged along a transverse axis of the housing.

In some examples, the power inverter comprises a current sensor to measure electric current in one of the plurality of terminals, the current sensor disposed in the third portion of the housing and coupled to the first wall.

One example provides a method of assembly for a power inverter of an electric drive unit, the method comprising: coupling a plurality of electrical switches to a first wall of a housing of the power inverter, the plurality of electrical switches to convert direct current (DC) power into alternating current (AC) power; coupling a power controller to the plurality of electrical switches opposite the first wall, the power controller to control the plurality of electrical switches; positioning a motor controller between the power controller and a second wall of the housing, the motor controller to control the power controller; and securing the motor controller to the second wall of the housing.

Additional and/or alternative features and aspects of examples of the present technology will become apparent from the following description and the accompanying drawings.

DETAILED DESCRIPTION

Figure 1:
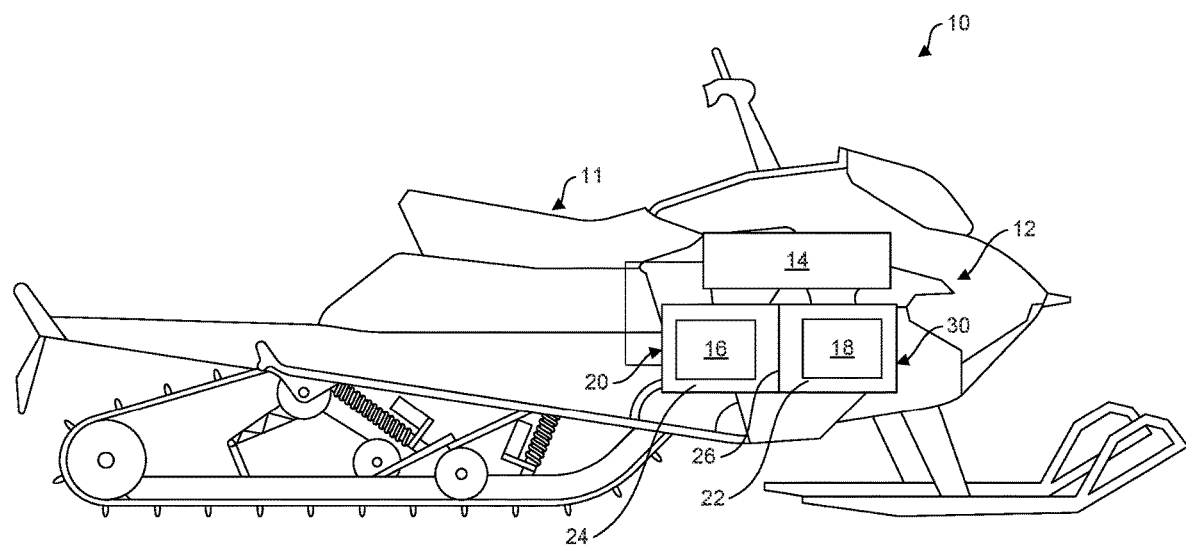
FIG. 1 illustrates an electric vehicle, in particular, an electric power sport vehicle, including a drive unit in accordance with one example of the present disclosure.

In the following detailed description, reference is made to the accompanying drawings which form a part hereof, and in which is shown by way of illustration specific examples in which the disclosure may be practiced. It is to be understood that other examples may be utilized and structural or logical changes may be made without departing from the scope of the present disclosure. The following detailed description, therefore, is not to be taken in a limiting sense. It is to be understood that features of the various examples described herein may be combined, in part or whole, with each other, unless specifically noted otherwise.

Electric powertrains for electric vehicles, including electric powersport vehicles (e.g., motorcycles, all-terrain vehicles (ATVs), personal watercraft (PWC), (e.g., side-by-side) utility task vehicles (UTVs) and snowmobiles), typically include a battery system, one or more electrical motors, each with a corresponding electronic power inverter (sometimes referred to as a motor controller), and various auxiliary systems (e.g., cooling systems). Efficiencies in size, weight, and energy consumption of system components improve vehicle performance (e.g., responsiveness, range, and reliability) and cost, particularly for electric powersport vehicles where space and weight are at a premium.

The conflicting requirements of being small and light, while also being robust, powerful and efficient have made designing and producing electric drive units for off-road powersport vehicles challenging. As used herein, the term "drive unit" refers to electric motors and associated motor controllers (i.e. power inverters) suitable for transmitting motive power. While particular examples of electric motors and associated motor controllers are described below, the term "drive unit" should not be limited to the examples provided and may encompass other designs and configurations for electric motors.

Off-road powersport vehicles differ from on-road automotive vehicles (e.g. cars, trucks and motorcycles) both in terms of the way they are driven and the performance expectations of their riders. Electric drive units for on-road automotive vehicles are designed to operate well below their maximum power capability during typical driving conditions (such as during city driving and/or highway driving). In contrast, according to one aspect of the present disclosure, off-road powersport vehicles are designed to operate fairly continuously at, or near, their maximum power capability. These powersport vehicles may provide an improved rider experience by enabling extended operation at high speeds and/or high torque values. For example, high torque may be useful in some off-road environments where a powersport vehicle might be prone to getting stuck (e.g., in deep snow). A challenge associated with continuously operating an electric drive unit of a powersport vehicle near its maximum power capability is mitigating the buildup of heat in the drive unit (e.g., preventing the overheating of a motor), which may reduce power and may also damage the drive unit. In some embodiments, electric drive units are designed and configured to address these challenges by providing a high efficiency at a maximum power capability. Increasing motor efficiency may, inter alia, reduce the amount of potentially harmful waste heat being generated at high motor speeds (i.e. rpm) and/or high torque values. Because electric drive units for on-road automotive vehicles are rarely operated at their maximum power capability, high efficiency at maximum power is typically not a concern for the electric drive units of on-road automotive vehicles.

In addition to providing high power at high motor efficiencies, electric drive units for powersport vehicles are designed to be relatively small to permit accommodation within the limited space available within the powersport vehicle. Electric drive units for powersport vehicles are also designed to be relatively light weight to maintain battery range-efficiency for the vehicle. The heavier the drive unit, the more energy (i.e., battery capacity) is required to achieve a desirable range.

To accommodate the requirements of the electric powersport vehicles according to the present disclosure (e.g., electric snowmobiles), some embodiments provide a drive unit that provides a continuous power density of greater than 5 kW/kg from the combination of a motor and inverter contained within a drive unit housing having a volume of less than 27,000 cm³. A compactly designed form factor for the motor and inverter, combined with a stator and rotor construction that balances motor losses with light weight power generation, provide a drive unit with performance characteristics suitable for an electric powersport vehicle. Specifically, the drive unit may provide a maximum efficiency at maximum power of greater than 96%, and in some embodiments greater than 97%. Further detail regarding such a drive unit is provided elsewhere herein. One aspect of the present disclosure provides a snowmobile having a drive unit comprising an electric motor, an electric inverter and a drive unit housing that together weigh less than 30 kg (and in some examples less than 26 kg) and provide a power density greater than 5 kW/kg.

FIG. 1 generally illustrates an electric vehicle 10 including an electric drive unit 30, in accordance with examples of the present disclosure. Although illustrated as a snowmobile for example purposes, electric vehicle 10 could be other types of electric vehicles, including other types of powersport vehicles such as personal watercraft (PWC) and side-by-side vehicles. Electric vehicle 10 includes a seat 11, which is shown as a straddle-seat, to accommodate an operator of electric vehicle 10. Electric vehicle 10 employs an electric powertrain 12 including a battery system 14, an electric motor 16, and an electronic power inverter 18 for controlling electric motor 16. Powertrain 12 is configured to propel the electric vehicle by driving one or more wheels (e.g., in the case of a motorcycle, ATV or UTV), by driving an endless track (e.g., in the case of a snowmobile) or by driving a propeller or impeller (e.g., in the case of a PWC).

In some examples, electric motor 16 may be a permanent magnet synchronous motor. Electric motor 16 may have a power output of between 120 and 180 horsepower. Alternatively, electric motor 16 may have a maximum output power of greater than 180 horsepower. In some examples, battery system 14 may include a rechargeable multi-cell lithium ion or other type of battery that provides a source of direct current (DC) power. Battery system 14 may include multiple battery units each including multiple battery cells. The battery cells may be pouch cells, cylindrical cells and/or prismatic cells, for example. The battery units may be housed within a battery enclosure for protection from impacts, water and/or debris. In some examples, battery system 14 may be configured to output electric power at a voltage of between 300-400 volts, or up to 800 volts, for example.

According to one example of the present disclosure, as will be described in greater detail herein, drive unit 30 includes a housing having a first compartment 22 and a second compartment 24 separated from one another by a shared wall 26. In one example, as illustrated, inverter 18 is disposed in first compartment 22 and motor 16 is disposed in second compartment 24. Together, housing 20 with motor 16 and inverter 18 disposed therein form drive unit 30 for electric vehicle 10.

As will be described in greater detail below, by disposing motor 16 and inverter 18 together within housing 20, drive unit 30 provides a volumetrically efficient form factor (e.g., a generally longitudinal form factor, such as a cylindrical form factor, for instance) which consumes less space within electric vehicle 10. Additionally, drive unit 30 provides shortened electrical conductor lengths between output terminal of inverter 18 and input terminals of motor 16 which reduces electrical inductance and line losses (relative to separately housed motor-inverter combinations). Accordingly, drive unit 30, in accordance with the present disclosure, provides efficiencies in both space and performance relative to conventional, separately housed motor-inverter combinations.

Figure 2:
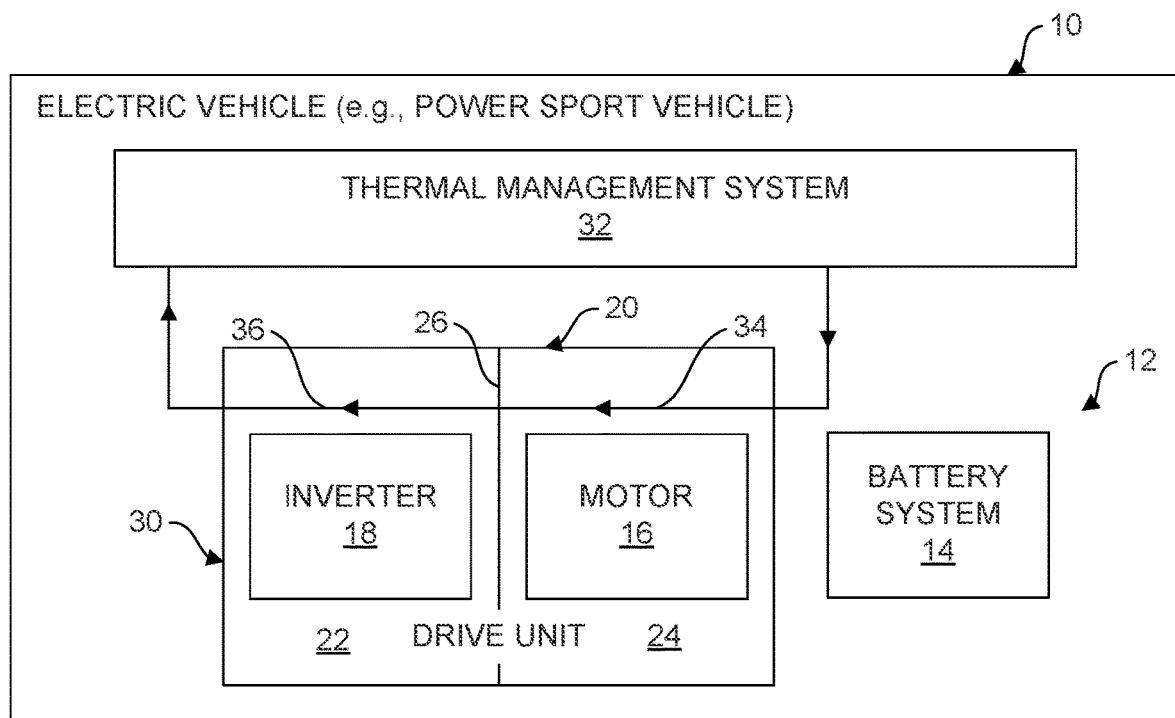
FIG. 2 is a block and schematic diagram illustrating an electric vehicle including a drive unit in accordance with the present disclosure.

FIG. 2 is a block and schematic diagram generally illustrating one example of electric vehicle 10, where, in addition to including electric powertrain 12 employing drive unit 30, electric vehicle 10 further includes a thermal management system 32. In one example, thermal management system 32 manages the temperatures (e.g., cooling) of electric powertrain 12 components, including battery system 14, motor 16, and inverter 18. Thermal management system 32 may be a closed-loop cooling system and/or an open-loop cooling system. The thermal management system 32 may utilize a liquid-to-liquid cooling system (e.g., in the case of a PWC), a snow-to-liquid cooling system (e.g., in the case of a snowmobile), an air-to-liquid cooling system (e.g., using a radiator), or a combination thereof. In accordance with examples of the present disclosure, as will be described in greater detail below, housing 20 of drive unit 30 includes a network of fluid circulation pathways 34 through which the thermal transfer fluid is circulated, as indicated arrows 36, to manage the temperatures of motor 16 and inverter 18.

Figure 3A:
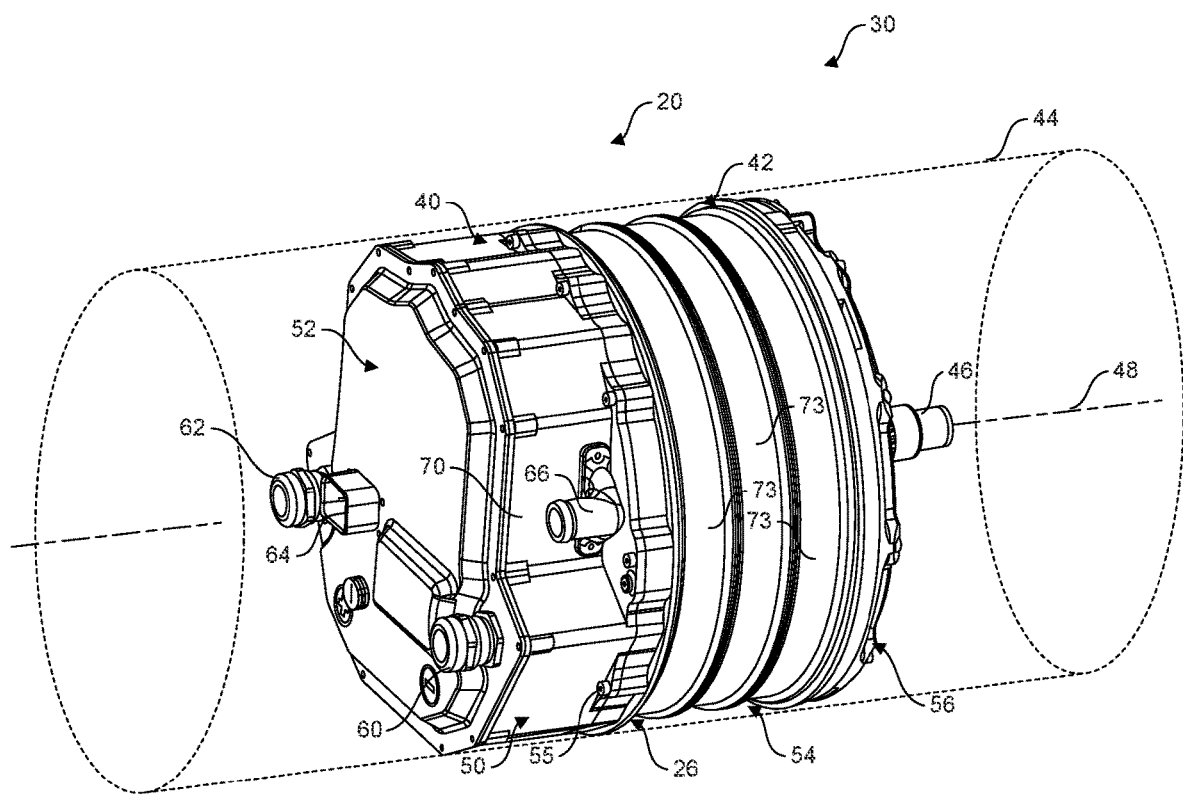
FIGS. 3A-3C are perspective views illustrating a drive unit, according to one example of the present disclosure.
Figure 3B:
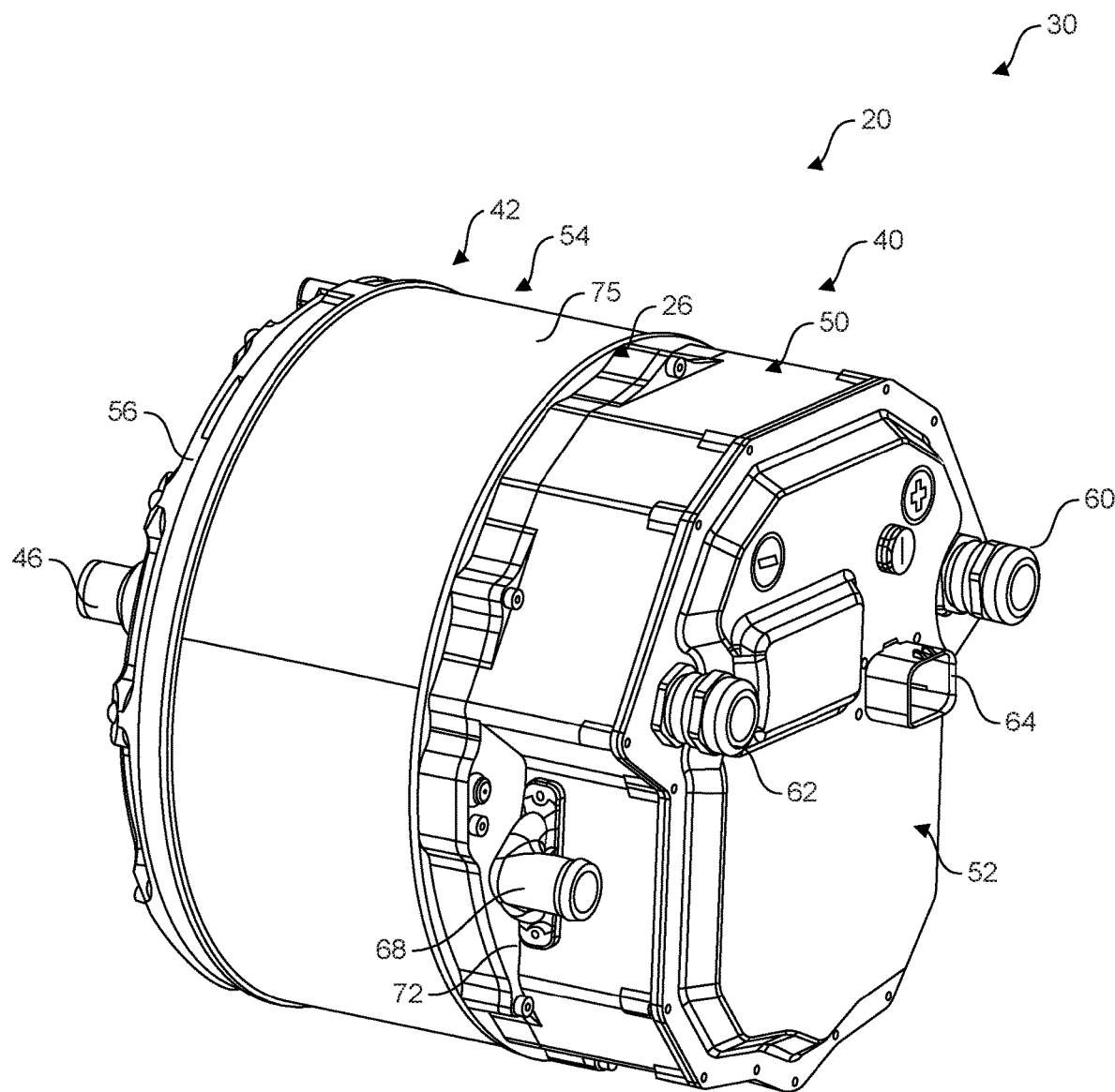
Figure 3C:
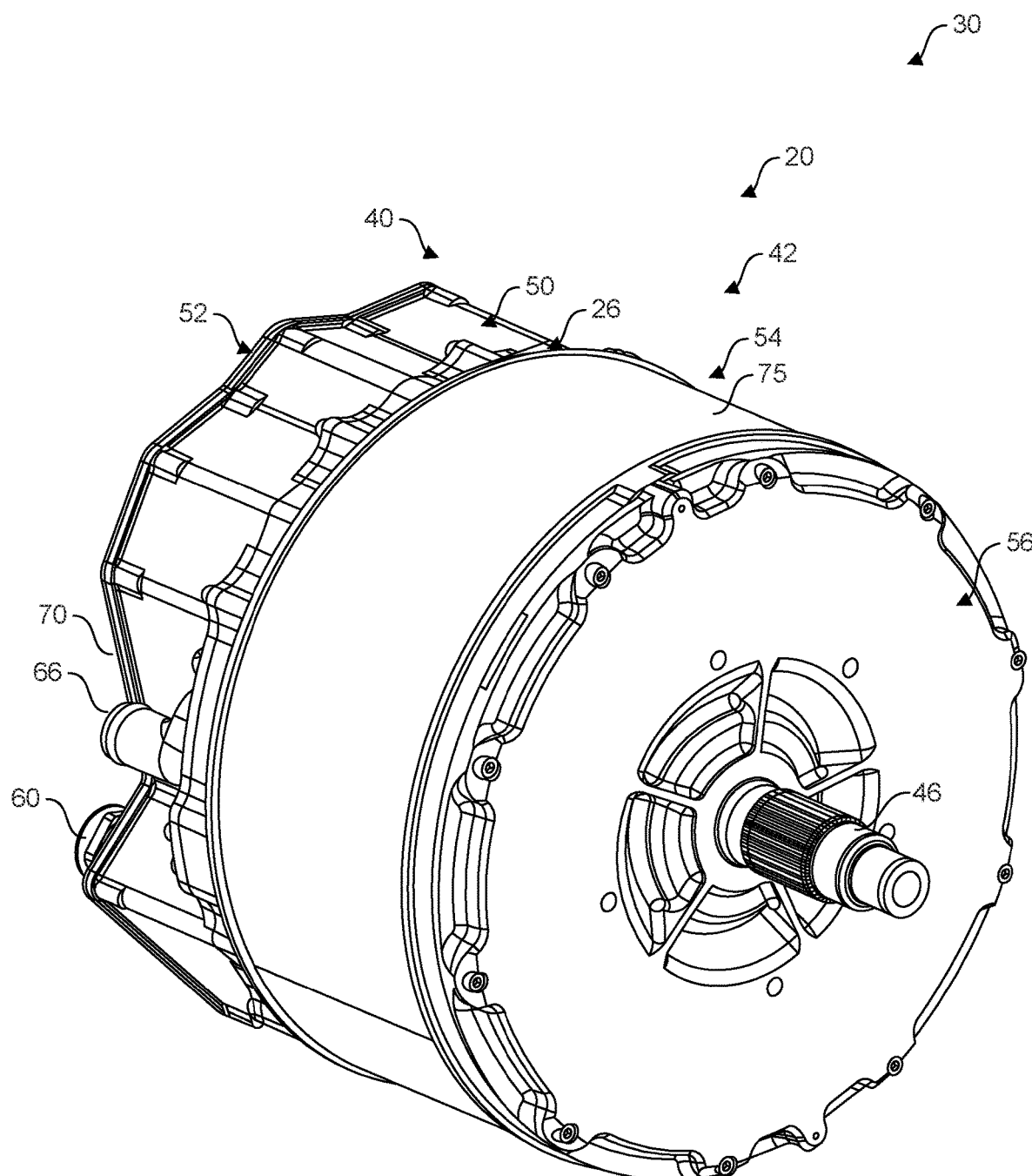
Figure 4:
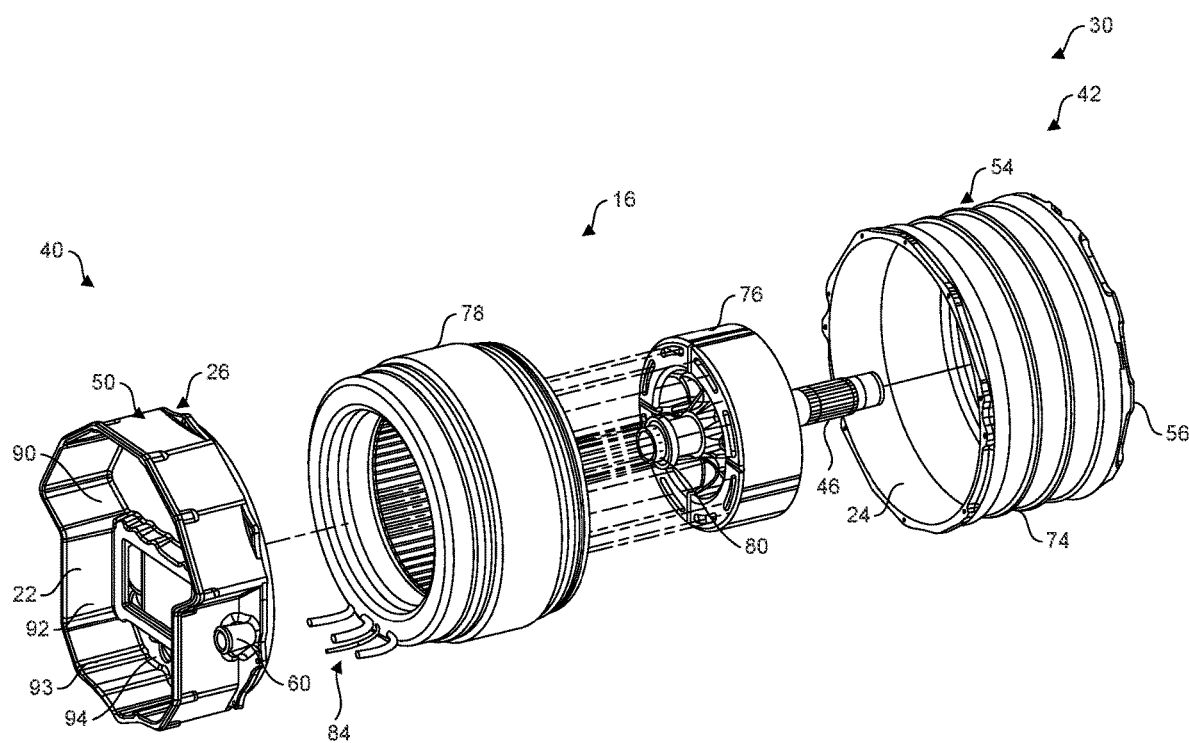
FIG. 4 is an exploded view illustrating portions of a drive unit, according to one example of the present disclosure.

FIGS. 3A-3C illustrate perspective views of drive unit 30, according to examples of the present disclosure. FIG. 4 is an exploded view illustrating portions of drive unit 30, according to one example. In some examples, housing 20 includes a first housing section 40 forming a first compartment 22 for housing inverter 18, and a second housing section 42 forming a second compartment 24 for housing electric motor 16. First and second housing sections 40 and 42 may each include at least some walls or other structural components of housing 20. While first and second housing sections 40 and 42 form first and second compartments 22 and 24, respectively, first and second housing sections 40 and 42 might not fully enclose first and second compartments 22 and 24.

In one example, a perimeter of housing 20 is confined within a generally longitudinal form factor 44 (graphically represented by dashed lines in FIG. 3A), where first and second housing sections 40 and 42, respectively forming first and second compartments 22 and 24, are disposed longitudinally relative to one another within the form factor. In one example, as illustrated, form factor 44 is generally cylindrical in shape with first and second housing sections 40 and 42 being disposed longitudinally relative to one another along a longitudinal axis 48 of generally cylindrical form factor 44. Shared wall 26 is generally circular in shape. In one example, longitudinal axis 48 of form factor 44 generally coincides with a longitudinal axis of a shaft 46 (i.e., a rotor shaft) of motor 16 (which extends from second housing section 42). In examples, as described below, first and second housing sections 40 and 42 are separable from one another.

In one example, first housing section 40 includes shared wall 26, which provides a base for first housing section 40 and which is disposed transversely to longitudinal axis 48 of form factor 44. Shared wall 26 may be integrally formed with first housing section 40. In one example, shared wall 26 is substantially circular in shape, but any suitable shape may be employed. First housing section 40 further includes a perimeter sidewall casing 50. In one example, as illustrated, perimeter sidewall casing 50 is ring- or band-shaped to form a generally tubular or circumferentially extending perimeter sidewall. In one example, the ring- or band-shaped perimeter sidewall casing 50 may be formed of a partial or continuous curved wall section, or may be formed from multiple straight wall sections extending from shared wall 26 that together form the ring- or band-shaped sidewall casing 50. In one example, perimeter sidewall casing 50 extends orthogonally from shared wall 26 and longitudinally relative to form factor 44, where shared wall 26 and circumferentially extending sidewall 50 together are generally can- or cup-shaped to form first compartment 22 for housing inverter 18. An end cover 52 is separably or removably coupled to sidewall casing 50 to enclose first compartment 22.

In one example, second housing section 42 includes a perimeter sidewall casing 54 separably coupled to shared wall 26, such as via a number of fasteners 55 (e.g., screws or bolts) arranged about perimeter sidewall casing 50 of first housing section 40. In one example, perimeter sidewall casing 54 is ring- or tube-shaped to form a generally tubular or circumferentially extending perimeter sidewall. In one example, perimeter sidewall casing 54 extends orthogonally from shared wall 26 and longitudinally relative to form factor 44 with shared wall 26 serving as a base for second housing section 42, and with shared wall 26 and perimeter sidewall casing 54 together being drum-shaped to form second compartment 24 for housing motor 16. An end cover 56 is separably coupled to an end of perimeter sidewall casing 54 opposite shared wall 26 to enclose second compartment 24. Alternatively, end cover 56 may be integrally formed with sidewall casing 54 of the second housing section 42, such that the shared wall 26 acts as an endplate for enclosing the second compartment 24.

While shared wall 26 is described as being part of first housing section 40, in other examples, shared wall 26 may be part of second housing section 42. In other examples, shared wall 26 may be separable from both first and second housing sections 40 and 42.

In one example, end cover 52 includes positive and negative DC connection terminals 60 and 62 extending therethrough for electrical connection of capacitors of inverter 18 (see 120 in FIG. 7) to battery system 14 (see FIGS. 1 and 2). In one example, end cover 52 includes an electrical connector 64 for low voltage and control signal connection to control circuitry of inverter 18 (see 124 in FIG. 7).

In one example, as will be described in greater detail below, first housing section 40 respectively includes inlet and outlet fluid ports 66 and 68 (see FIG. 3B-3C) for connecting fluid pathways of thermal management system 32 to fluid pathways within housing 20 of drive unit 30 for cooling of motor 16 and inverter 18. Inlet 66 may receive a fluid from thermal management system 32, and outlet 68 may discharge the fluid back into thermal management system 32. It is noted that in other examples, inlet and outlet fluid ports 66 and 68 may be reversed, and that in other examples, more than one inlet and/or outlet port may be employed. In one example, as illustrated, sidewall casing 50 includes recesses 70 and 72 in which inlet and outlet fluid ports 66 and 68 are respectively disposed so that inlet and outlet fluid ports 66 and 68 are disposed within the confines of form factor 44.

In one example, as illustrated by FIG. 3A, a number of channels 73 extend circumferentially about sidewall casing 54 of second housing section 42. When a casing sleeve 75 is disposed about the circumference of sidewall casing 54, channels 73 become fluid pathways 74 (see FIG. 6) extending about the circumference of second housing section 42, where such fluid pathways 74 are part of the network of fluid pathways 34 through which fluid 36 is circulated by thermal management system 32 (see FIG. 2) to cool motor 16. In some examples, fluid pathways 74 may form a continuous spiral around sidewall casing 54. In other examples, fluid pathways 74 may be separate pathways disposed in parallel with one another. In other examples, fluid pathways 74 may be a continuous pathway employing a switchback configuration. Any number of suitable implementations may be employed.

Reference is now made to FIG. 4, which illustrates end cover 52 being removed from sidewall casing 50 of first housing section 40, and showing first and second housing compartments 22 and 24. Motor 16 includes a rotor 76 and a stator 78 which are disposed within second compartment 24 of second housing section 42. As will be described in greater detail below (see FIG. 9), an end 80 of shaft 46 facing shared wall 26 is hollow to enable circulation of thermal transfer fluid there through to cool motor 16. A set of electrical input leads 84 extend from stator 78 for connection to inverter 18 within compartment 22 of first housing section 40.

Figure 7:
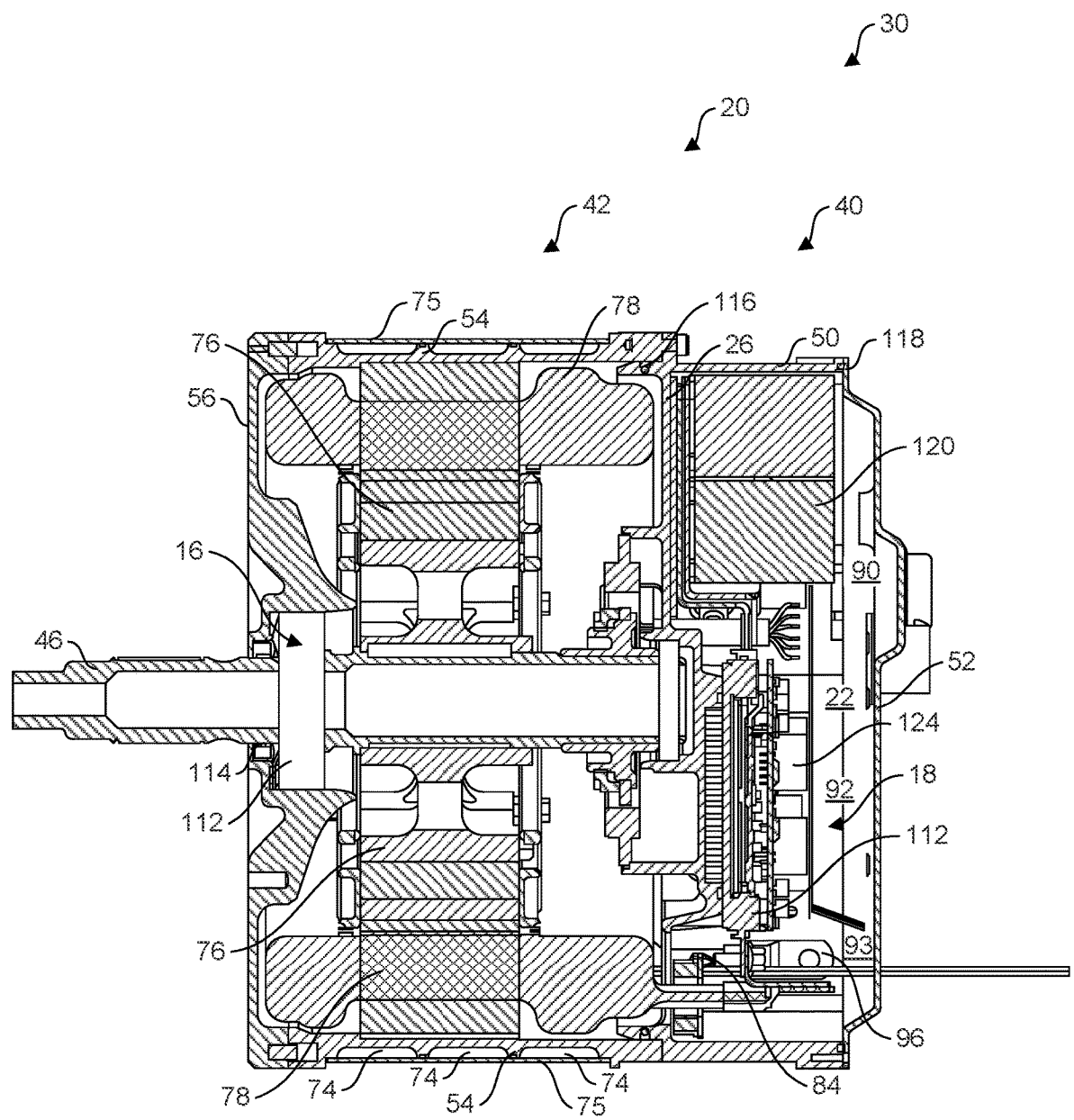
FIG. 7 is a cross-sectional view of a drive unit, according to one example of the present disclosure.

In one example, first compartment 22 of first housing section 40 includes a first compartment portion 90 for housing capacitors of inverter 18, and a second compartment portion 92 for housing electronic control and switching components (e.g., insulated-gate bipolar transistors (IGBTs)) of inverter 18 (see 122 and 124 in FIG. 7). In one example, a set of one or more openings 94 extend through shared wall 26 to enable electrical connection between input leads 84 of stator 78 and output terminals of inverter 18. First compartment 22 may further include a third compartment portion 93. As shown, second compartment portion 92 may be adjacent to both first compartment portion 90 and third compartment portion 93. In one example, second compartment portion 92 may be disposed between first compartment portion 90 and third compartment portion 93 along a radial or transverse axis of housing 20. In one example, input leads 84 from stator 78 extend through openings 94 into third compartment portion 93 for connection to output terminals of inverter 18. In other examples, output terminals of inverter 18 may extend through openings 94 into second housing section 42 for connection to input leads 84 of stator 78.

In one example, second compartment portion 92 and third compartment portion 93 may be considered a single compartment portion. In this way, first compartment 22 may only include two compartment portions.

Figure 5:
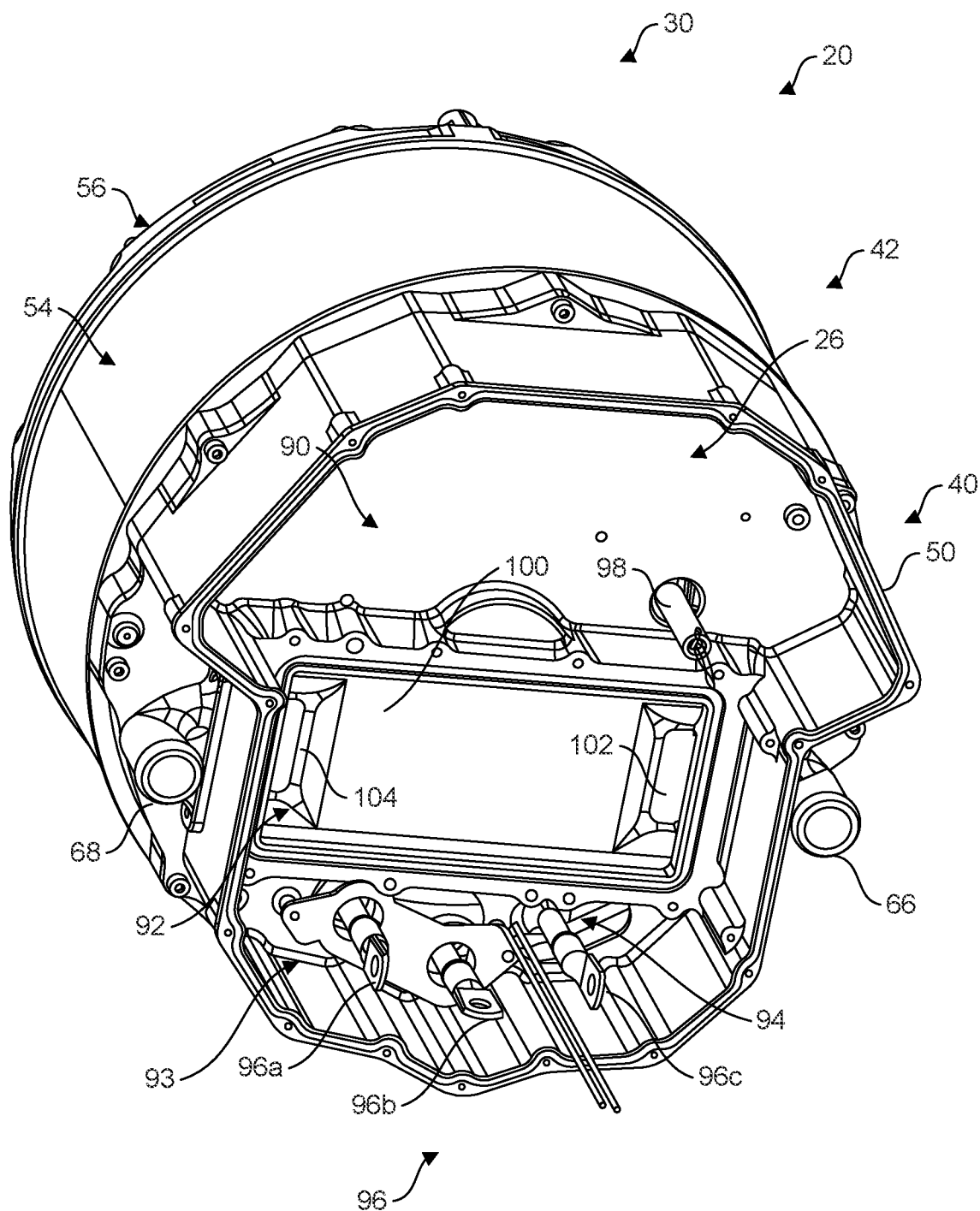
FIG. 5 is a perspective view illustrating portions of an inverter housing of a drive unit, according to one example of the present disclosure.

FIG. 5 is a perspective view illustrating first housing section 40 with end cover 52 removed. In one example, input power leads 84 of stator 78 extend through the set of openings 94 in shared wall 26 and terminate at a set of terminals 96 (illustrated as terminals 96a, 96b, and 96c) in third compartment portion 93. Sensor wiring 98 extends from motor 16 through shared wall 26 to inverter control electronics. For example, sensor wiring may connect to a resolver 98 in motor 16 to provide information regarding the position of rotor 76. By aligning the set of openings 94 through shared wall 26 (see also FIG. 8) with input leads 84 of stator 78 and with terminals 96, the lengths of conductor pathways between inverter 18 and stator 78 are reduced which, in-turn, reduces electrical inductances and power loss, thereby improving the electrical efficiency of drive unit 30.

As discussed in further detail elsewhere herein, housing 20 includes a network of fluid pathways 34 (also referred to as a fluid network) extending therethrough for cooling of motor 16 and inverter 18. In one example, in addition to inlet and outlet ports 66 and 68, fluid network 34 includes a fluid chamber 100 in shared wall 26 having a fluid inlet 102 and a fluid outlet 104 connecting fluid chamber 100 with other portions of the fluid network 34. It is noted that a cover over fluid chamber 100 is not shown in FIG. 5. In one example, a switching module including a network of power switches (e.g., IGBTs) is mounted to shared wall 26 over fluid chamber 100 so as to be cooled by fluid circulated there through.

Figure 6:
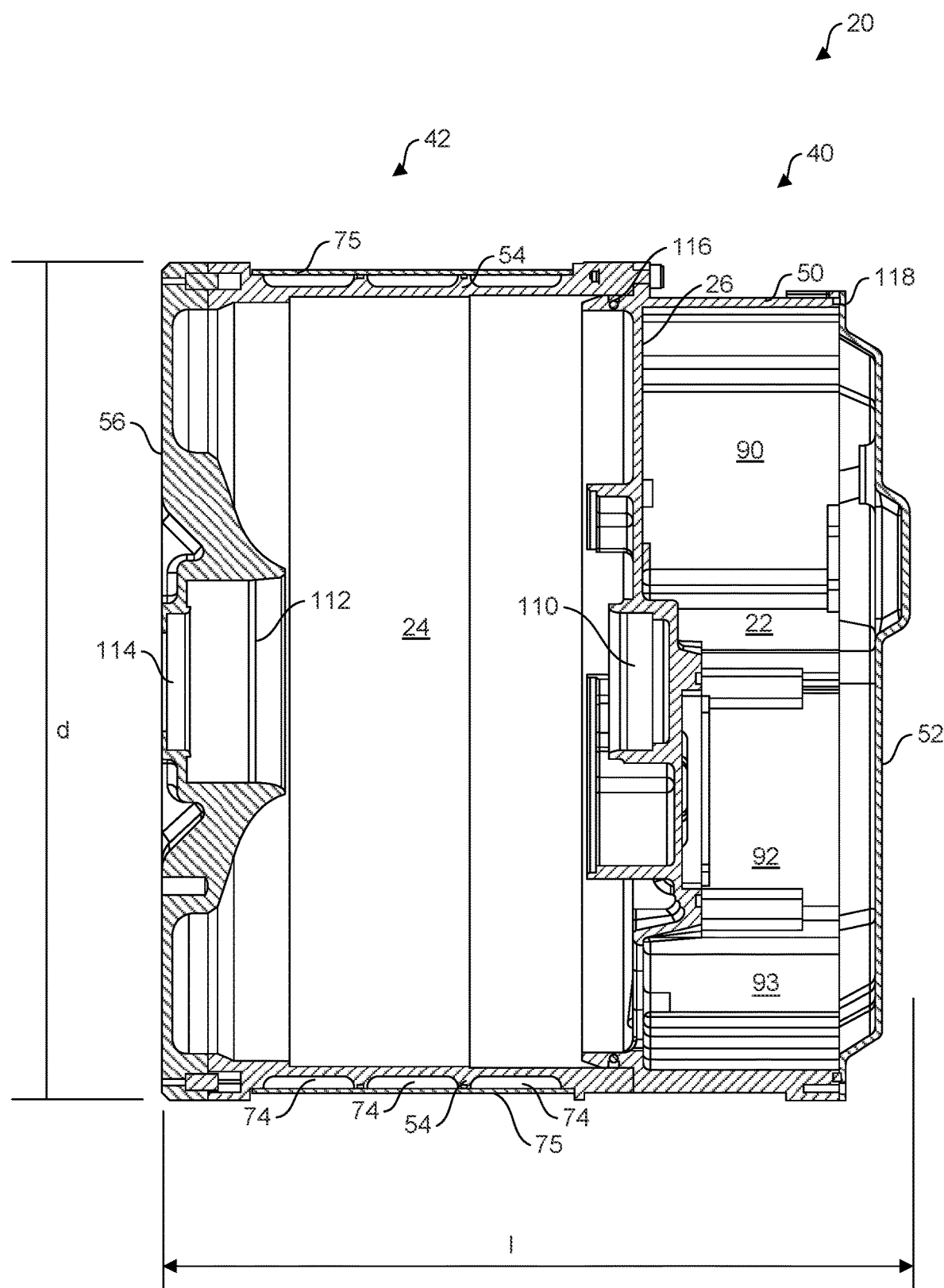
FIG. 6 is a cross-sectional view of a drive unit housing, according to one example of the present disclosure.

FIG. 6 is a cross-sectional view of housing 20, according to one example, where sidewall casing 50 of first housing section 40 contiguously and integrally extends from shared wall 26, and which together with end cover 52 forms first compartment 22. First compartment 22 includes first compartment portion 90 for housing capacitors of inverter 18, second compartment portion 92 for housing control and switching electronics of inverter 18, and third compartment portion 93 for housing terminals 96. In one example, shared wall 26 includes a bearing pocket 110 facing second compartment 24, where bearing pocket 110 is to receive end 80 of shaft 46 of electric motor 16 and through which thermal transfer fluid circulates, as described below. In one example, fluid circulated through fluid chamber 100 acts to cool bearing pocket 110 and/or end 80 of shaft 46.

Sidewall casing 54 and end cover 56 of second housing section 42 together with shared wall 26 form second compartment 24. End cover 56 includes a bearing pocket 112 to receive an opposing end of shaft 46 of motor 16 and an aperture 114 from which shaft 46 extends. Gaskets 116 and 118 respectively form seals between shared wall 26 and sidewall casing 54 to seal second compartment 24, and between end cover 52 and sidewall casing 50 to seal first compartment 22.

FIG. 7 is a cross-sectional view of drive unit 30, according to one example. DC capacitors 120 of inverter 18 are disposed in first compartment portion 90, power switching network 122 and control electronics 124 of inverter 18 are disposed in second compartment portion 92, and terminals 96 are disposed in third compartment portion 93. Input power leads 84 from stator 78 of motor 16 extend through shared wall 26 and terminate at terminals 96 in third compartment portion 93. Motor 16 is disposed within second compartment 24 with hollow end 80 of shaft 46 disposed within bearing pocket 110 of shared wall 26. Further detail regarding DC capacitors 120, power switching network 122 and control electronics 124 is provided elsewhere herein.

Figure 8:
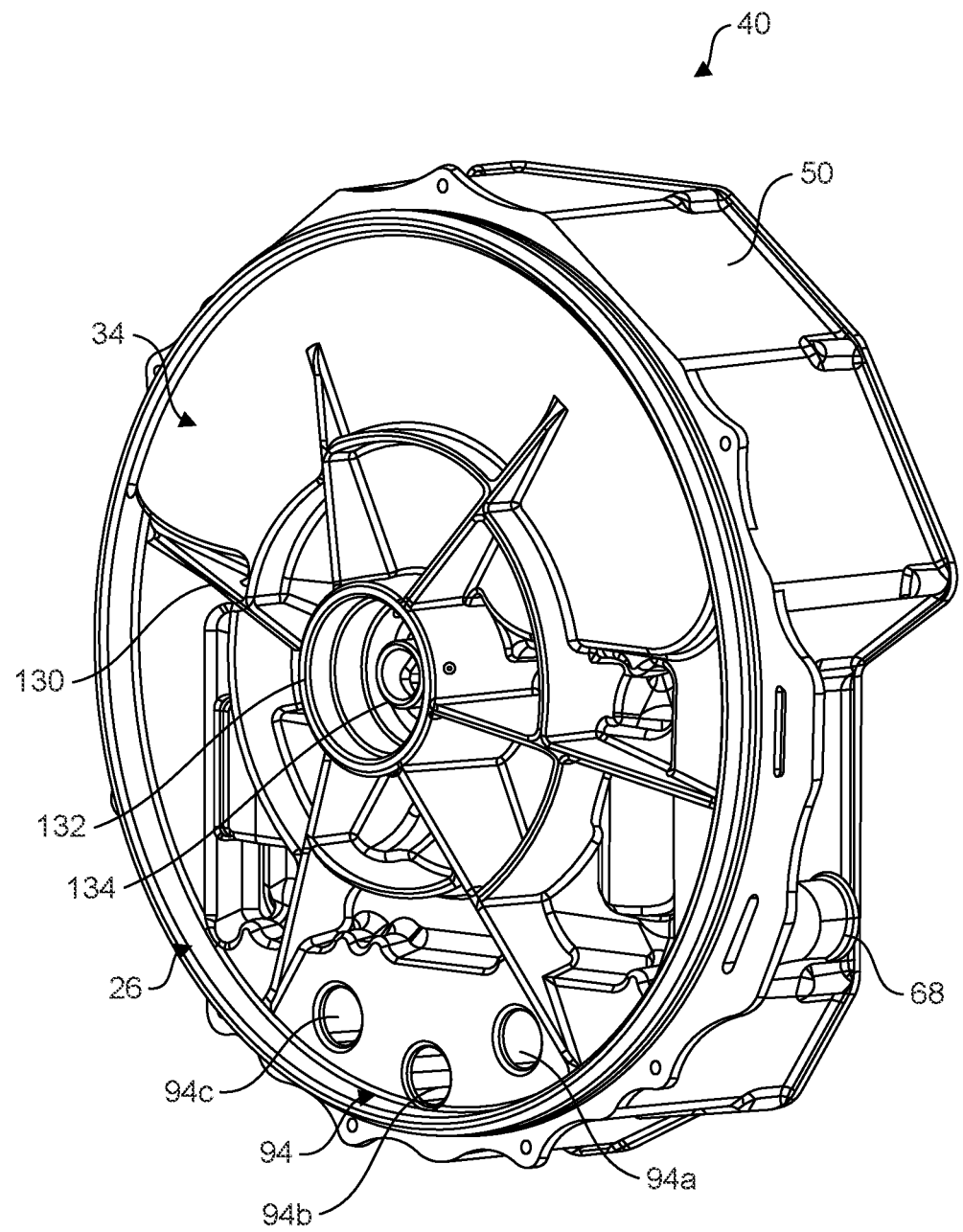
FIG. 8 is a perspective view illustrating portions of a shared wall of a drive unit housing, according to one example of the present disclosure.

FIG. 8 is a perspective view illustrating portions of first housing section 40 facing second (motor) compartment 24 including shared wall 26 and sidewall casing 50, according to one example. In one example, as illustrated, sidewall casing 50 contiguously extends from shared wall 26 such that shared wall 26 and sidewall casing 50 form a single base component for first housing section 40. A plurality of ribs, such as rib 130, extend from an inner surface of sidewall casing 50 to support a central hub 132 including bearing pocket 110 for supporting hollow end 80 of shaft 46 of motor 16. Also illustrated is the set of openings 94 through shared wall 26, illustrated as openings 94a-94c arrayed along an arc to align with input leads 84 of stator 78 (see FIG. 4). While three openings 94a-94c are shown in the Figures, this is exemplary only. In one example, shared wall 26 may include a single opening 94 for input leads 84 and terminals 96, or any other suitable number of openings 94.

In one example, end wall 26 includes a portion of the network of fluid pathways 34 through which a thermal transfer fluid is circulated to cool components of motor 16 and inverter 18. The network 34 of fluid pathways, which will be described in greater detail below (see FIG. 10) includes inlet and outlet ports 66 and 68, as well as fluid chamber 100 having inlet and outlet 102 and 104 (see FIG. 5). In one example, network 34 further includes a tube 134 which extends within hub 132 and, as will be described below (see FIG. 9), extends into hollow end 80 of shaft 46 to form inlet and outlet fluid pathways within shaft 46 to enable circulation of thermal transfer fluid therein to cool motor 16.

Figure 9:
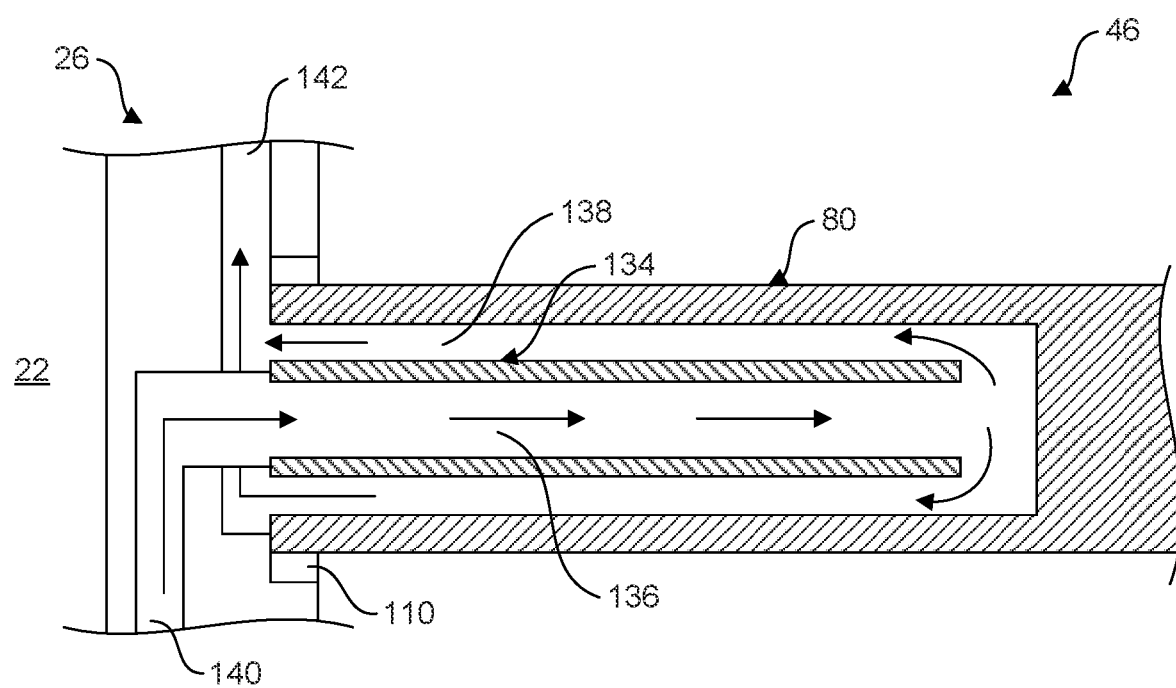
FIG. 9 is a schematic diagram illustrating a cross-sectional view of a hollow portion of a motor shaft, according to one example of the present disclosure.

FIG. 9 is a schematic diagram generally illustrating the circulation of thermal transfer fluid within hollow end 80 of shaft 46. As illustrated, tube 134 extends into hollow end 80 of shaft 46 from bearing pocket 110 (disposed within hub 132) to form an inlet fluid pathway 136 within tube 134, and an outlet fluid pathway 138 between the outer wall of tube 134 and inner wall of shaft 46. In this way, tube 134 and hollow end 80 of shaft 46 form fluid pathways in shaft 46. In one example, inlet and outlet fluid pathways 136 and 138 are respectively in fluid communication with fluid pathways 140 and 142 of the network of fluid pathways 34 (see FIG. 10 below).

Figure 10A:
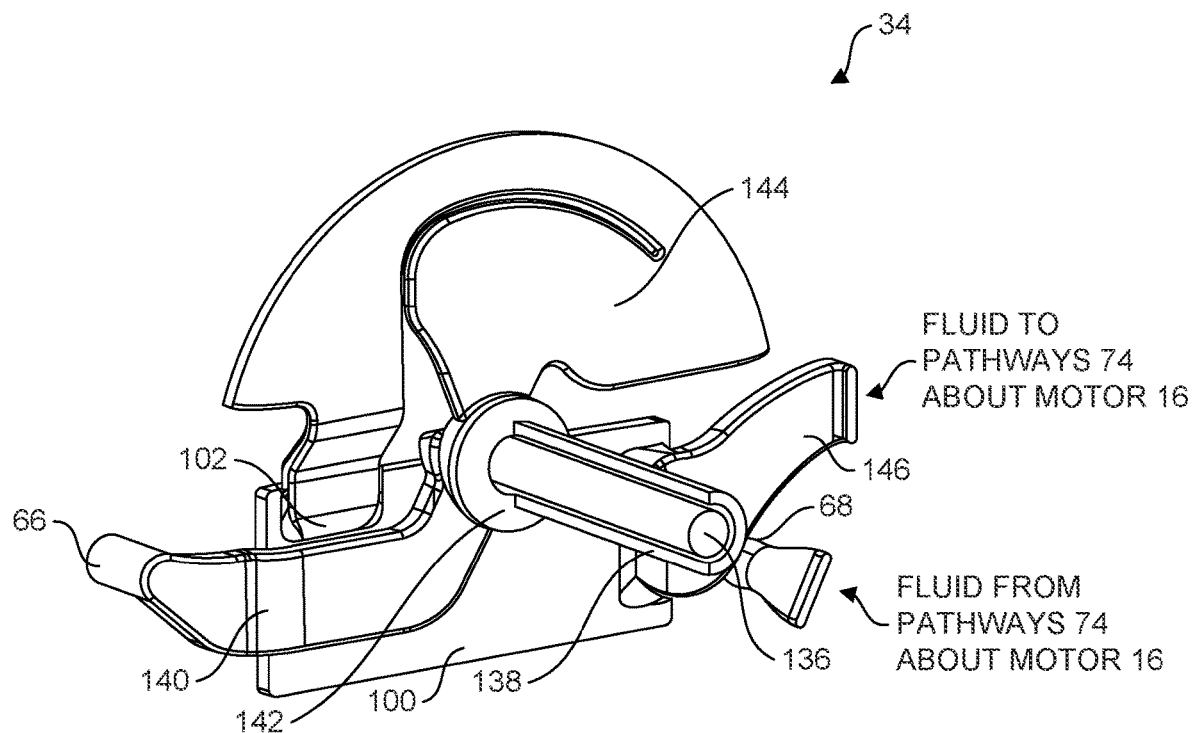
FIGS. 10A-10B are perspective views illustrating portions of a network of fluid circulation pathways for circulating a thermal transfer fluid through a drive unit, according to one example of the present disclosure.
Figure 10B:
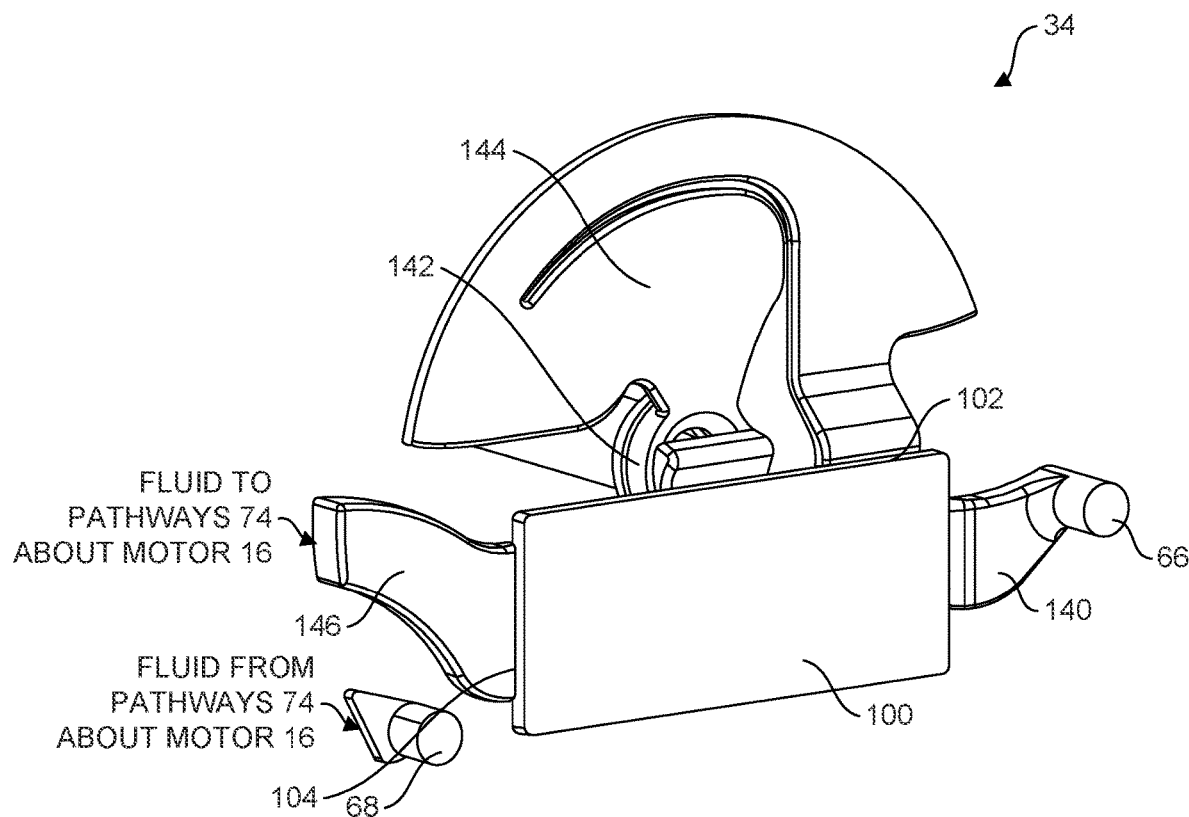

FIGS. 10A and 10B are perspective views illustrating portions of network 34 of fluid pathways, according to one example, for circulating thermal transfer fluid through housing 20 to cool components of motor 16 and inverter 18. FIGS. 10A and 10B illustrate network 34 as respectively viewed from second (motor) compartment 24 and first (inverter) compartment 22.

In one example, as illustrated, thermal transfer fluid is received via inlet port 66 and travels through pathways 140 to inlet fluid pathway 136 within tube 134 inside shaft 46 (see FIG. 9). Fluid then travels through outlet fluid pathway 138 and exits shaft 46 via fluid pathway 142, which is concentrically disposed about end 80 of shaft 46. Fluid then travels through a fluid pathway 144, which forms a fan-like, semicircular path along or within shared wall 26 proximate to first compartment portion 90 of first compartment 22 to cool DC capacitors 120 of inverter 18 (see FIG. 7).

Fluid then enters chamber 100 via inlet opening 102, where fluid within chamber 100 cools the power switching network 122 and control electronics 124 of inverter 18 disposed within second compartment portion 92 of first compartment 22 (see FIG. 7). Fluid then exits chamber 100 via outlet opening 104 and travels through a fluid pathway 146 to fluid pathways 74 circumferentially disposed about sidewall casing 54 of second housing section 42 to cool motor 16 (see, for example, FIGS. 3A and 7). Fluid then exits fluid pathways 74 to outlet port 68.

In one example, the fluid pathways of network 34 of fluid pathways forms a continuous fluid pathway through housing 20 such that the components of drive unit 30 are cooled in series (e.g., shaft 46, capacitors 120, power switching network 122, and motor stator 78). In one example, the fluid pathways of shared wall 26 are disposed in series with the fluid pathways of perimeter sidewall 54 of second housing section 42 between inlet and outlet ports 66 and 68. In one example, the fluid pathways of shared wall 26 and perimeter sidewall 54 of second housing section 42 are disposed in series with fluid pathways within hollow end 80 of shaft 46 of electric motor 16.

By employing a single continuous cooling loop, the cooling system is simplified (relative to systems employing parallel pathways), such that the network of fluid pathways 34 of the present disclosure provides high efficiency and requires fewer parts relative to known systems. Additionally, disposing the network of fluid pathways 34 within the confines of housing 20 (i.e., within form factor 44), including disposing inlet and outlet ports 66 and 68 on end cover 52 of first housing section 40 maintains the perimeter of drive unit 30 within the generally longitudinally extending form factor 44 (see FIG. 3A). As described above, such form factor is volumetrically efficient and provides improved ease of installation within electric vehicles (particularly electric powersport vehicles).

It is noted that the network of fluid pathways 34 specifically described herein is for illustrative purposes, and represents only one example implementation of fluid network 34. In the example shown, the fluid pathways 34 travel from an inlet port 66, to the shaft 46, to the channels within the shared wall 26, to the circumferentially disposed pathways 74 in the sidewall casing 54, and finally to the outlet port 68. In other examples, the configuration of the fluid pathways of fluid network 34 and the order in which components are cooled may be different from that illustrated herein. In another example, the fluid pathways 34 may travel from an inlet port 66, to the channels within the shared wall 26, to the shaft 46, to the circumferentially disposed pathways 74 in the sidewall casing 54, such that the inverter 18 components are cooled prior to the motor components. For example, fluid network 34 may be implemented such that thermal transfer fluid is first directed to cool DC capacitors 120 of inverter 18, as such capacitors may have a narrow thermal tolerance. Any number of configurations are possible. Further, one or more pathways in the network of fluid pathways may be omitted in some examples. For example, a network of fluid pathways may omit fluid pathways in shaft 46. The fluid pathways may travel from an inlet port 66, to the channels within the shared wall 26, to the circumferentially disposed pathways 74 in the sidewall casing 54, and finally to the outlet port 68.

Housing 20 may be made, in whole or in part, from metals, metal alloys, composites and/or plastics. Similarly, the channels/pathways of fluid network 34 may be made, in whole or in part, from metals, metal alloys, composites and/or plastics. It is further noted that the components of housing 20, including the channels/pathways of fluid network 34 may be manufactured according to any know technique, including machining, casting, and 3D-printing, for example.

In one example as shown in FIG. 6, the form factor 44 of the housing 20 of the drive unit 30 that is suitable for a powersport vehicle 10 may have a length "l" of 10 cm to 30 cm and a diameter "d" of 20 cm to 30 cm, or width and depth "w", in the case of a square or rectangular cross-section, of 20 cm to 30 cm each. Accordingly, the volume of the form factor of the housing 20 may be in the order of 4,000 $cm^3$ to 27,000 $cm^3$. In some examples, the volume of the form factor of the housing 20 may be in the order of 10,000 $cm^3$ to 20,000 $cm^3$. In some examples, the volume of the form factor of the housing 20 may be in the order of 18,000 $cm^3$. In one example, the thickness of the shared wall 26 may be between 3 mm and 8 mm, which provides a sufficient thickness to accommodate channel 144 and chamber 100. It should be understood that the form factor 44 and shared wall 26 thickness may have any suitable dimensions, and that these dimensions may vary depending on the application and power requirements of the drive unit 30.

In one example, the motor 16, the inverter 18 and the housing 20 of the drive unit 30 may have a combined weight of less than 30 kg (and in some cases less than 26 kg) when there is no fluid circulating within the network of fluid pathways. In another example, the motor 16, the inverter 18 and the housing 20 of the drive unit 30 may have a combined weight of less than 25 kg. In some examples, the motor 16, the inverter 18 and the housing 20 of the drive unit 30 may have a combined weight of between 23 kg and 30 kg, and in some examples, between 24 kg and 26 kg.

Figure 11:
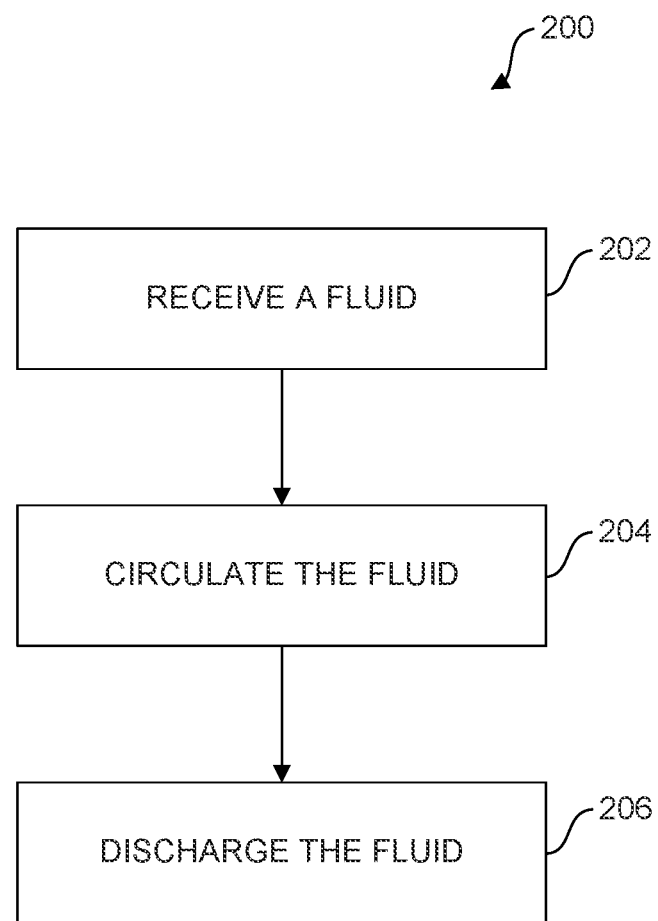
FIG. 11 is a flow diagram illustrating a method, according to one example of the present disclosure.

FIG. 11 is a flow diagram illustrating a method 200 for cooling components of a drive unit, according to one example of the present disclosure. The method 200 may be performed by a drive unit housing such as housing 20, for example. Block 202 includes receiving a fluid via an inlet port of the housing. For example, block 202 may include inlet 66 receiving a fluid. Block 204 includes circulating the fluid. In some examples, the fluid is circulated through fluid pathways formed in the housing to cool an electrical inverter and/or an electrical motor. For example, block 204 may include circulating the fluid through fluid pathways formed in a shared wall (e.g., shared wall 26) of the housing to cool the electrical inverter. The shared wall may separate a first compartment of the housing in which the electrical inverter is disposed and a second compartment of the housing in which the electric motor is disposed. Alternatively or additionally, block 204 may include circulating the fluid through fluid pathways formed in a perimeter sidewall of the housing (e.g., perimeter sidewall casing 54) to cool the electric motor. Alternatively or additionally, block 204 may include circulating the fluid through fluid pathways formed in a rotor shaft (e.g., shaft 46) of the electric motor to cool the electric motor. Block 206 includes discharging the fluid via an outlet port of the housing, such as outlet port 68, for example.

Figure 12A:
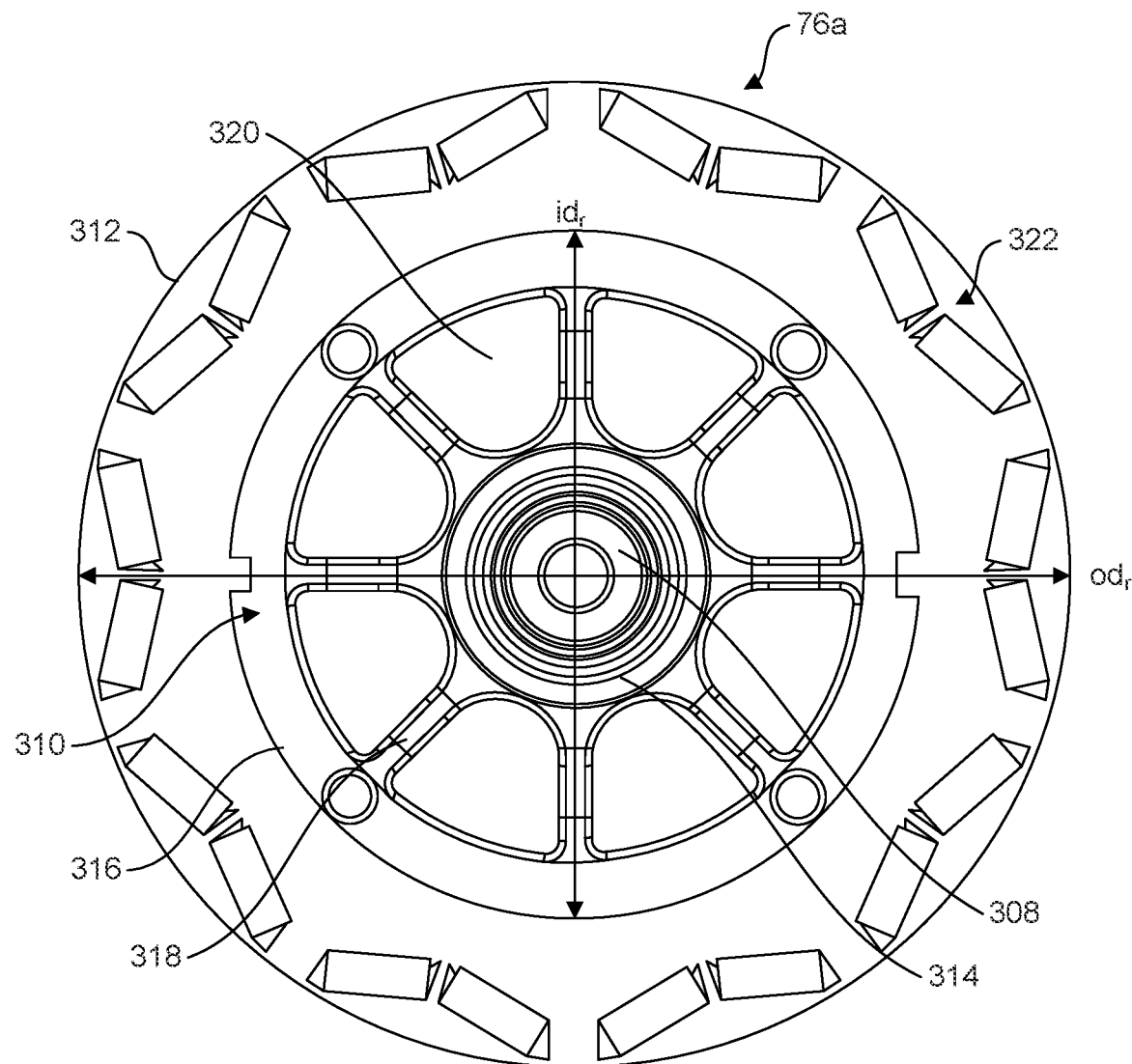
FIG. 12A is a front plan view of a rotor of a drive unit, according to one example of the present disclosure.
Figure 12B:
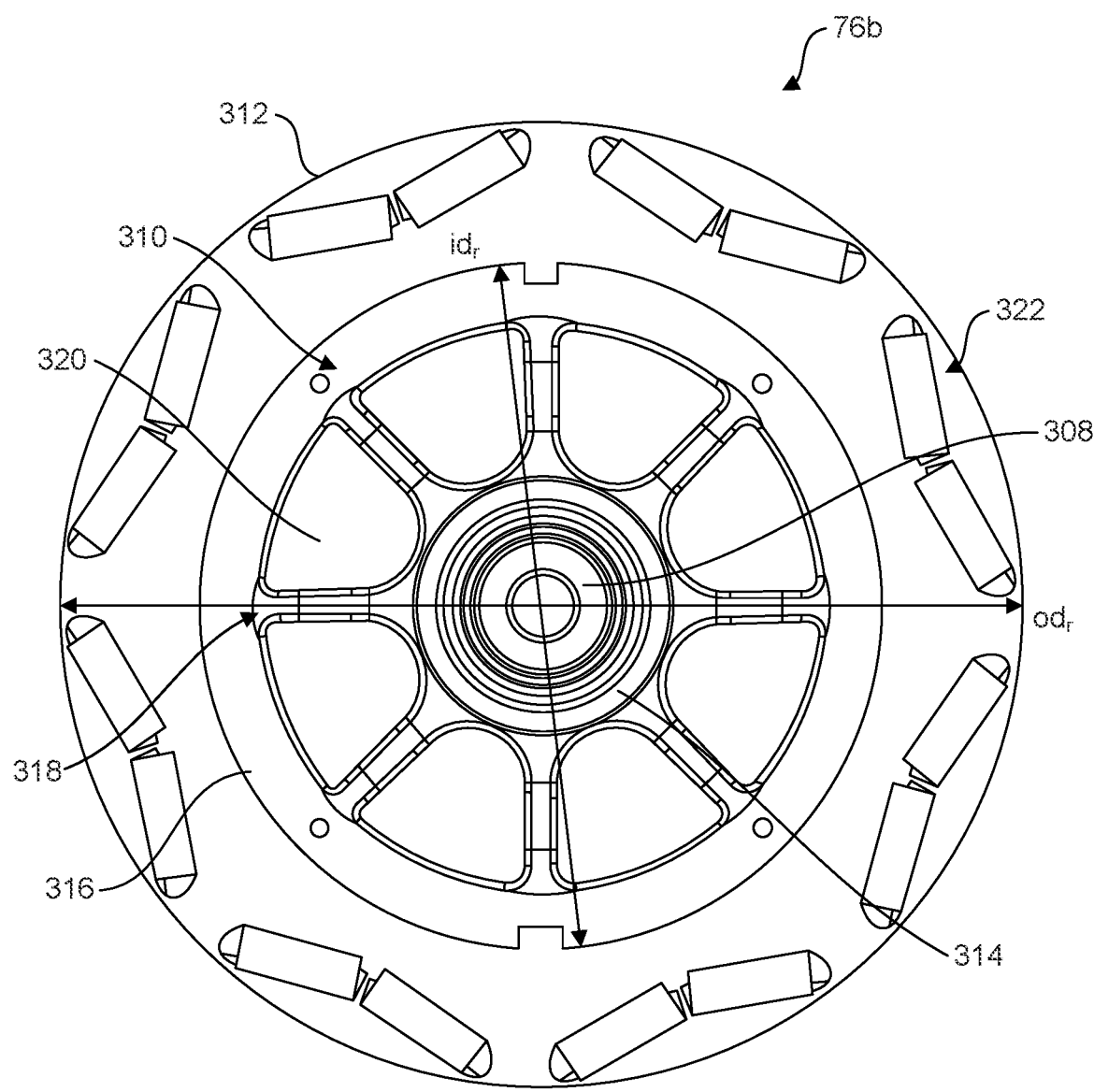
FIG. 12B is a front plan view of a rotor of a drive unit, according to another example of the present disclosure.

FIG. 12A is a front plan view of a rotor 76a, and FIG. 12B is a front plan view of a rotor 76b, according to examples of the present disclosure. FIGS. 12A and 12B provide two different examples of rotors 76a, 76b suitable for use with drive unit 30. Like components will be described using like reference numbers for both rotors 76a, 76b. Rotors 76a, 76b each comprise a rotor shaft 308, a hub 310 and a rotor laminate 312 located radially outward from the hub 310, such that the hub is positioned between the rotor shaft 308 and the rotor laminate 312. The hub 310 may comprise a material that is less dense than the rotor laminate 312. In one example, the hub 310 may be made of aluminum. In one example, the hub 310 may comprise an inner hub 314 surrounding the rotor shaft 308, an outer hub 316 in communication with the rotor laminate 312 and spokes 318 extending between the inner hub 314 and the outer hub 316, creating void regions 320 of no material between circumferentially adjacent spokes 318. The less dense material of the hub 310 and the void regions 320 of no material, create weight efficiencies which improve power density for the drive unit 30.

The rotor laminate 312 may comprise a steel material, such as silicon steel, or nickel-iron steel, among other possibilities. An inner diameter $id_r$ of the rotor laminate 312 may be greater than 90 mm. In some examples, the inner diameter $id_r$ may be between 90-120 mm. In some examples, the inner diameter $id_r$ may be between 105-115 mm.

An outer diameter $od_r$ of the rotor laminate 312 may be less than 170 mm. In some examples, the outer diameter $od_r$ of the rotor laminate 312 may be between 150-165 mm. In some examples, the outer diameter $od_r$ of the rotor laminate 312 may be between 155-160 mm.

An axial length of the rotor may be in the order of 45-65 mm, and in some examples in the order of 50-60 mm.

Embedded within the rotor laminate 312 are magnets 322. In one example, pairs of the magnets 322 are positioned in a V-shape. The V-shape of magnets 322 provides increased flux and thus increased power to the drive unit 30 compared to magnets positioned in a straight arrangement and spanning the same circumference of the rotor laminate 312. More specifically, the V-shape magnets provide a greater magnet surface area than a straight magnet occupying the same rotor surface (i.e. two sides of a triangle as opposed to one straight side). The V-shape topology also provides higher dq inductances which provide more torque and wider speed range than a rotor with a straight magnet occupying the same rotor surface.

With reference to FIG. 12A, the magnets 322 of rotor 76a comprise 10 poles. With reference to FIG. 12B, the magnets 322 of rotor 76b comprise 8 poles. The magnets 322 of rotor 76b are larger than the magnets of rotor 76a. The magnets 322 of rotor 76b may comprise a volume of greater than 7000 mm$^3$, and in some examples greater than 7500 mm3. In one example, the magnets 322 of rotor 76b have a volume between 7300 mm$^3$ and 7600 mm$^3$. In contrast, the magnets 322 of rotor 76a may have a volume between 6400 mm$^3$– 6700 mm$^3$. The use of larger magnets with a reduced number of poles may reduce the core losses in comparison to a rotor having smaller magnets and a larger number of poles.

Figure 13A:
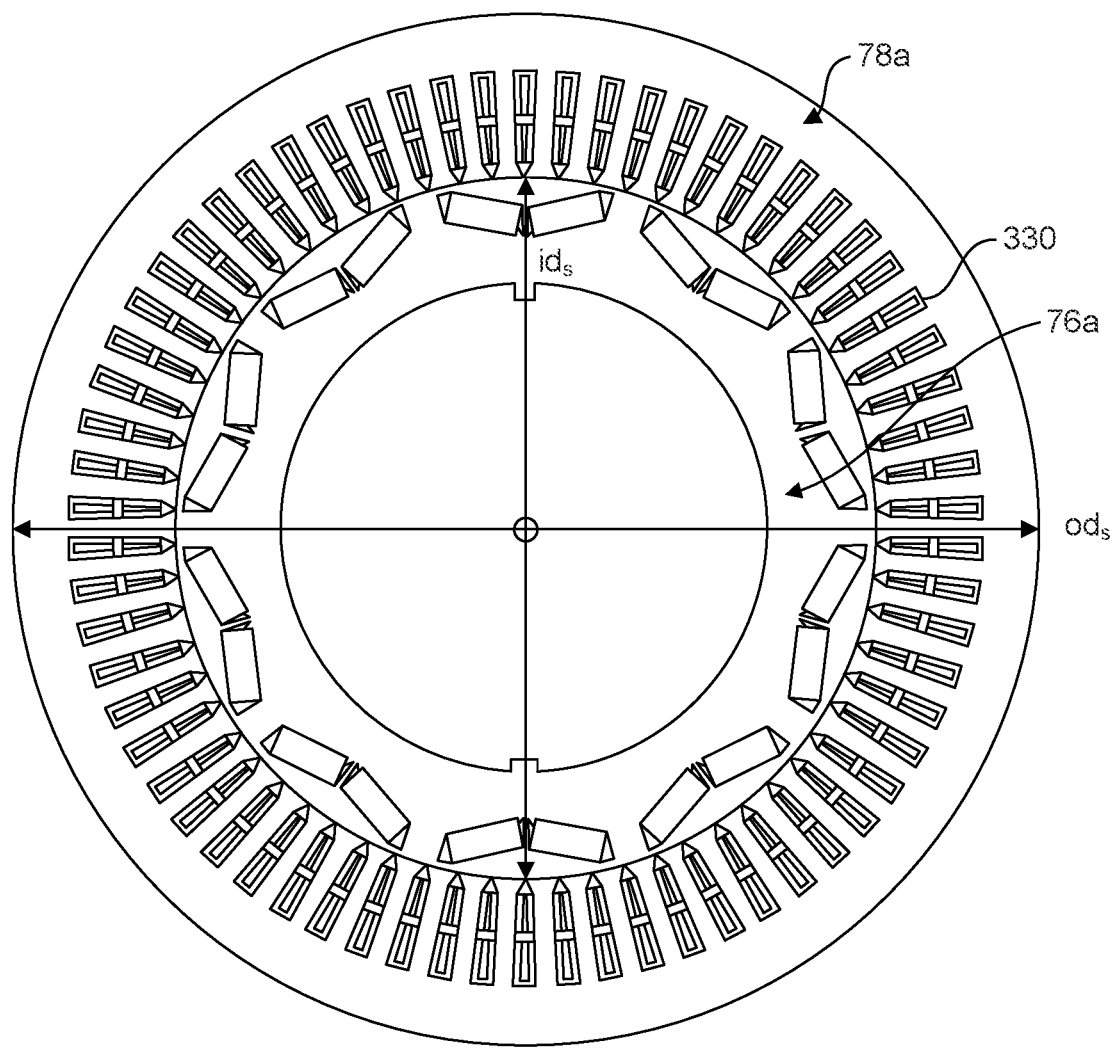
FIG. 13A is a front plan view of a rotor and stator of a drive unit, according to one example of the present disclosure.
Figure 13B:
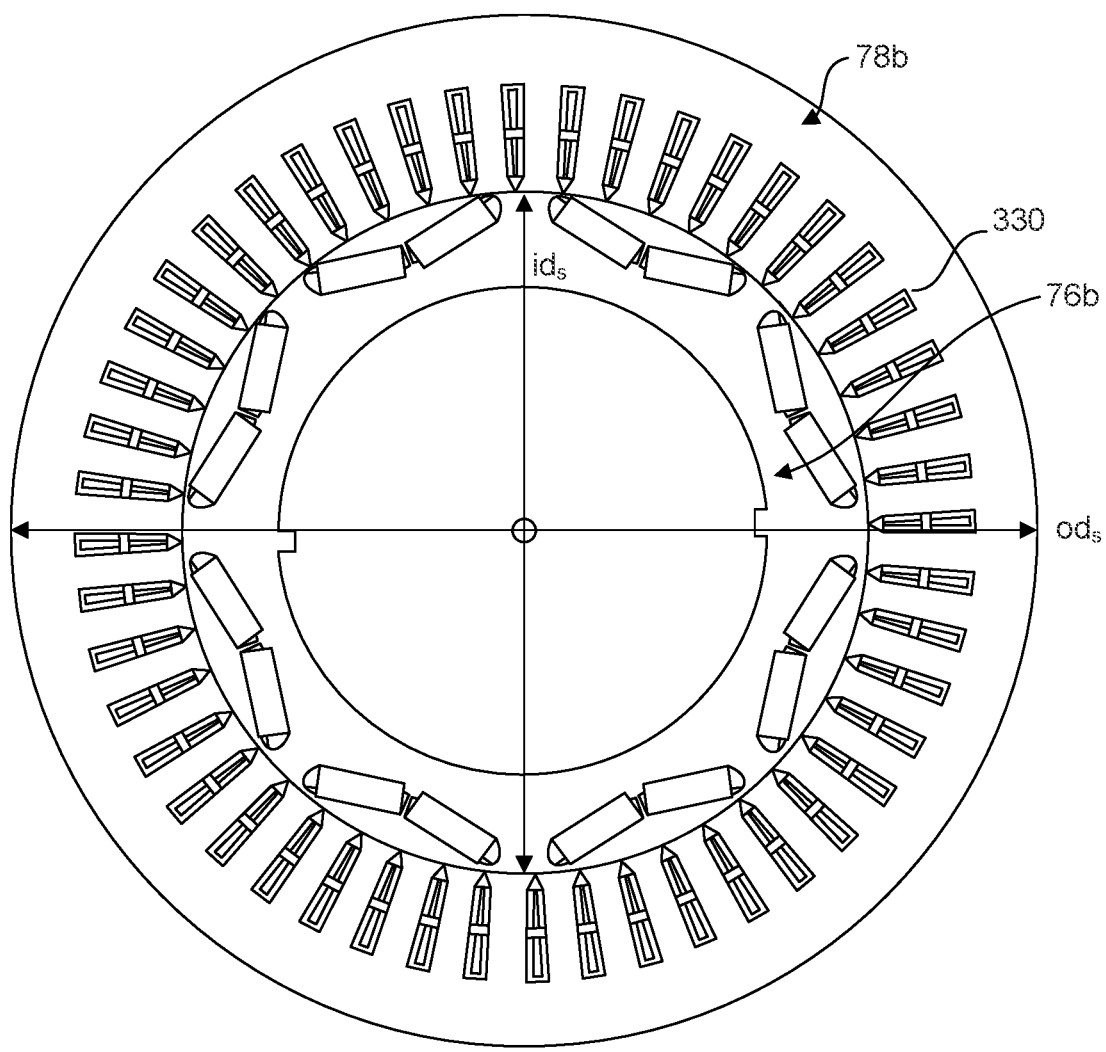
FIG. 13B is a front plan view of a rotor and stator of a drive unit, according to another example of the present disclosure.

FIG. 13A is a front plan view of rotor 76a and a stator 78a, and FIG. 13B is a front plan view of rotor 76b and a stator 78b, according to examples of the present disclosure. With reference to FIG. 13A, rotor 76a is shown together with a corresponding stator 78a. Stator 78a comprises sixty six (66) slots 330 with a double layer asymmetric winding pattern having one turn per coil. With reference to FIG. 13B, rotor 76b is shown together with a corresponding stator 78b. Stator 78b comprises forty eight (48) slots 330 with a single layer symmetric winding pattern having four parallel paths (coils) with three turns per coil, which is more practical for automated mass-manufacturing. Furthermore, a winding pattern having three turns per coil provides an increased inductance compared to a winding pattern having less turns per coil. The increased inductance provides a smoother current supply making the drive unit easier to control while limiting the power via a voltage limit.

The stators 78a and 78b may have an inner diameter $id_s$ greater than 150 mm. In some examples, the inner diameter $id_s$ may be between 150-170 mm. In some examples, the inner diameter $id_s$ may be between 155-160 mm.

An outer diameter $od_s$ of the stator 78a, 78b may be less than 250 mm. In some examples, the outer diameter $od_s$ may be between 230 mm-250 mm. In some examples, the outer diameter $od_s$ of the stator 78a, 78b may be between 230-240 mm.

An air gap between the outer diameter $od_r$ of the rotor 76a, 76b and the inner diameter $id_s$ of the stator 78a, 78b may be approximately 0.5 mm-1 mm.

Although not shown in the Figures, in one example, either rotor 76a or rotor 76b may provide a rotor skew where the rotor is divided into slices along its axial length, with each slice being shifted in relation to the other slices. In one example, rotor 76a, 76b may be divided into three slices with each slice shifted (e.g. rotated) by approximately 2-4 degrees in relation to an adjacent slice. In some embodiments, the rotor 76a, 76b may be divided into more or less slices, with each slice shifted by between 1.5 and 4 degrees in relation to an adjacent slide. Providing a rotor skew may reduce cogging torques which may reduce the instant forces required to start rotating the rotor. In the case of powersport vehicles such as snowmobiles where a rider may be required to push the vehicle out of a snowbank or snowdrift, having reduced cogging torques may facilitate pushing the vehicle from a stopped state and may reduce the level of vibration and acoustic noise of the powertrain.

Figure 14:
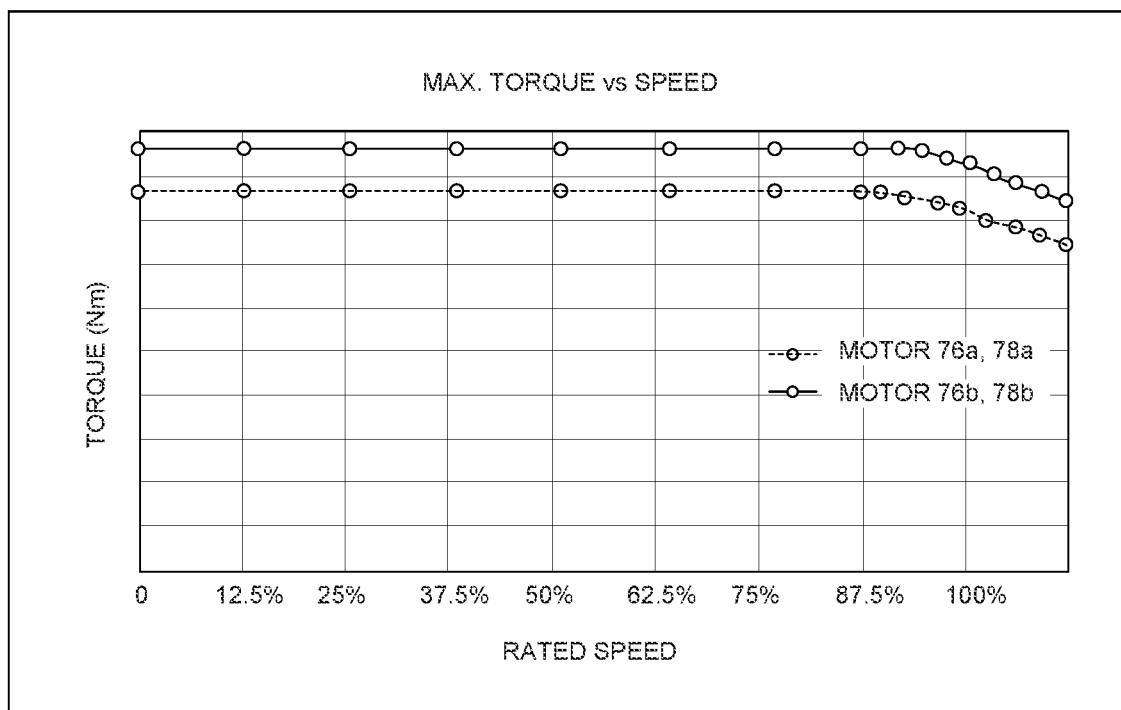
FIG. 14 is a graph illustrating a torque vs speed curve for a drive unit, according to one example of the present disclosure.

Shown in FIG. 14 is a normalized maximum torque to rated speed graph for the motors of FIGS. 13A and 13B. In one example, the arrangement of windings and magnets for motors 16 having stator and rotor 76a, 78a and stator and rotor 76b, 78b provide relatively consistent (e.g. flat) torque for speeds up to 75% to 88% of a rated speed. In some examples, flux weaking, where the voltage in the windings becomes equal to the DC voltage in the battery, starts to occur after approximately 88% of a rated speed. Designing the motor 16 to have flux weakening occur after approximately 88% of a rated speed allows for high power with minimal losses. In one example, the arrangement of windings and magnets for the motors 16 having stator and rotor 76a, 78a and stator and rotor 76b, 78b provide a max power at speeds of greater than 75% of a rated speed, and in other examples at speeds of greater than 80%, and in yet other examples (FIG. 14) at speeds of greater than 88% of a rated speed. If flux weakening were designed to occur at lower motor speeds, the max torque provided to the motor could be higher, but this would sacrifice the maximum power capable of being provided by the motor, which would be less desirable for powersport vehicles. In one example, motor 16 may have a rated speed of between 7000 rpm and 12000 rpm and a peak speed of between 8000 rpm-15000 rpm.

In one example, the arrangement of windings and magnets for motors 16 having stator and rotor 76a, 78a and stator and rotor 76b, 78b provide a torque density of between 7.0 and 8.0 Nm/kg, and in some examples between 7.2 and 7.8 Nm/kg.

The design and packaging of motor 16, including stator and rotor 76a, 78a or stator and rotor 76b, 78b, helps provide a compact form factor and high-power densities for drive unit 30. The design and packaging of inverter 18 may also contribute to a compact form factor and high-power densities for drive unit 30.

Figure 15:
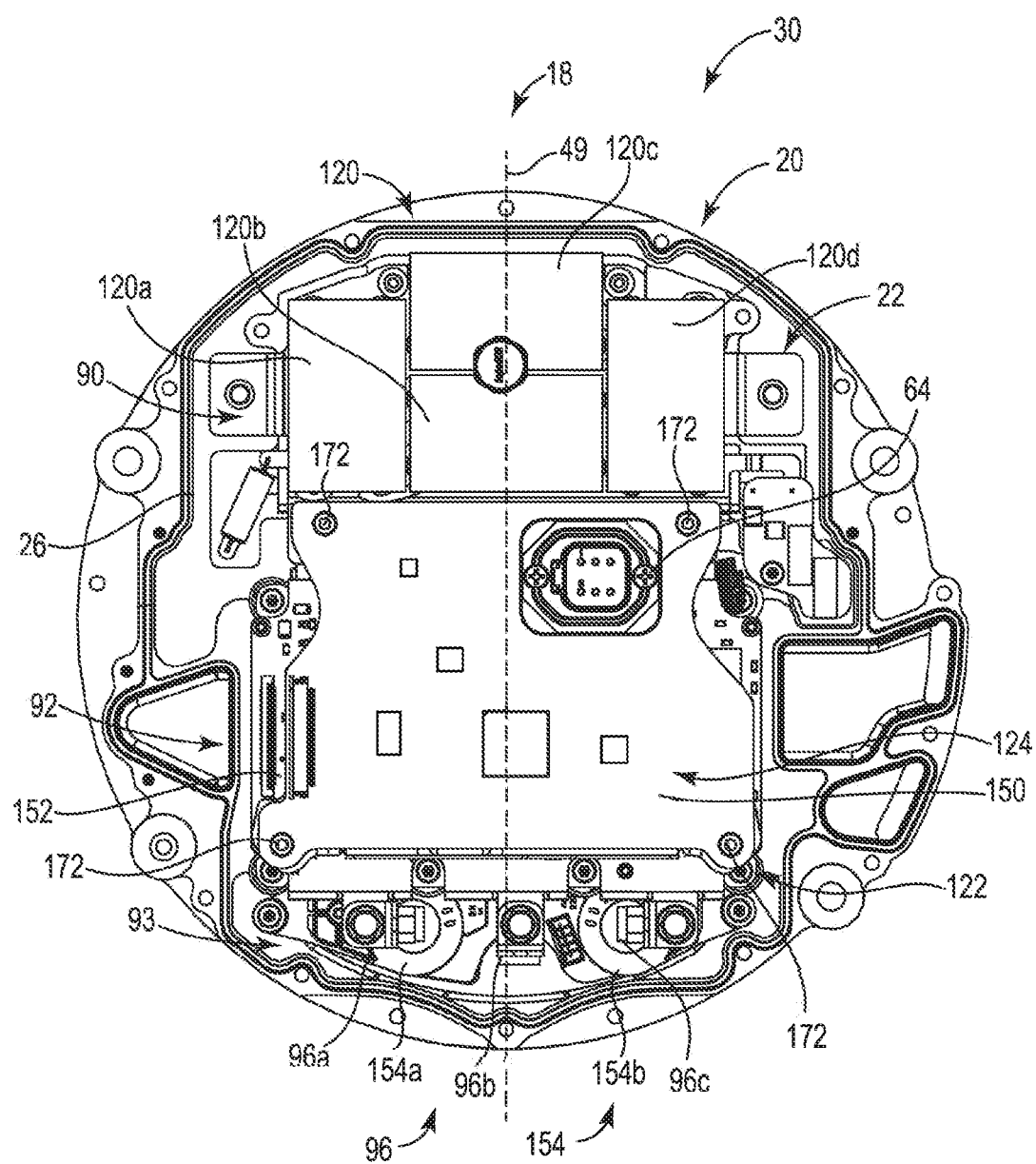
FIG. 15 is a plan view of an inverter of a drive unit with the end cover removed, according to one example of the present disclosure.

FIG. 15 is a plan view of inverter 18 of drive unit 30 with end cover 52 removed, according to one example of the present disclosure. FIG. 15 illustrates the arrangement of capacitors 120, power switching network 122, control electronics 124 and terminals 96 along a transverse axis 49 (or radial axis) of drive unit 30. Capacitors 120, power switching network 122, control electronics 124 and terminals 96 are disposed within first compartment 22 of housing 20, which is formed between shared wall 26 and opposing end cover 52.

First compartment portion 90 of first compartment 22 may house a DC bus or DC link of inverter 18. Capacitors 120 are disposed within first compartment portion 90. Also disposed within first compartment portion 90 may be high and low DC voltage leads (see 190, 192 in FIG. 19). The high and low DC voltage leads may be connected to battery system 14 via DC connection terminals 60, 62. In the illustrated example, capacitors 120 include a bank of four capacitors 120a, 120b, 120c, 120d. Each of capacitors 120 are connected between the high and low DC voltage leads of inverter 18. Capacitors 120 may reduce the voltage variations between the high and low DC voltage leads. Capacitors 120 may also or instead provide a low-impedance path for ripple currents generated by power switching network 122.

Second compartment portion 92 of first compartment 22 includes power switching network 122 and control electronics 124 to convert DC power from battery system 14 to alternating current (AC) power to drive motor 16. In some examples, motor 16 is a three-phase motor and power switching network 122 converts the DC power into three-phase AC power. Power switching network 122 is connected to the high and low DC voltage leads in first compartment portion 90 to receive the DC power. The configuration and arrangement of power switching network 122 and control electronics 124 in second compartment portion 92 is discussed in further detail elsewhere herein.

Third compartment portion 93 of first compartment 22 includes terminals 96 connected to outputs of the power switching network 122 to transfer the AC power to motor 16. For example, terminals 96 may be connected to input leads 84 of stator 78 within third compartment portion 93. When motor 16 is a three-phase motor, each of terminals 96a, 96b, 96c may transfer a different phase of AC power from power switching network 122 to motor 16.

Third compartment portion 93 may further include current sensors 154 to measure the current in one or more terminals 96 and input leads 84. In the illustrated example, current sensor 154a measures the current flowing through terminal 96a (and the associated input lead 84) and current sensor 154b measures the current flowing through terminal 96c (and the associated input lead 84). In some examples, current sensors 154 are Hall effect sensors; however, other types of sensors may also or instead be implemented. Current sensors 154 may have a ring-link structure and be positioned around the periphery of the terminals 96 and/or input leads 84 to measure magnetic fields using the Hall effect. Current in the terminals 96 and/or input leads 84 may then be calculated based on the magnitude of the magnetic field. In some examples, current sensors 154 are coupled to the shared wall 26 using fasteners and/or adhesives. Additionally, current sensors 154 may be disposed within respective cavities or recesses formed in shared wall 26. In this way, current sensors 154 may be integrated into shared wall 26 to improve space-efficiency in third compartment portion 93.

Second compartment portion 92 may be adjacent to both first compartment portion 90 and third compartment portion 93 in inverter 18, which may reduce the length of connections between different components in first, second and third compartment portions 90, 92, 93. For example, as shown in FIG. 15, the arrangement of first, second and third compartment portions 90, 92, 93 along transverse axis 49 (i.e., with second compartment portion 92 being disposed between first compartment portion 90 and third compartment portion 93) enables components of inverter 18 to be arranged linearly or in series. Capacitors 120 are adjacent to power switching network 122, and power switching network 122 is adjacent to terminals 96. In this way, the length of electrical connections between capacitors 120, power switching network 122 and terminals 96 may be reduced, which may in turn reduce the inductance in inverter 18. Reducing inductance may improve the performance of inverter 18, such as by reducing voltage spikes that may be harmful to inverter 18, drive unit 30 and/or battery system 14, for example. Further, reducing inductance in inverter 18 may allow the capacitance and corresponding size of capacitors 120 to be reduced, which may enable a smaller form factor for inverter 18.

It should be noted that other ways of arranging second compartment portion 92 adjacent to both first compartment portion 90 and third compartment portion 93 are also contemplated. For example, first, second and third compartment portions 90, 92, 93 may each occupy a respective sector of first compartment 22 (i.e., a respective space enclosed between an arc on the periphery of first compartment 22 and two radii at either end of that arc).

Figure 16:
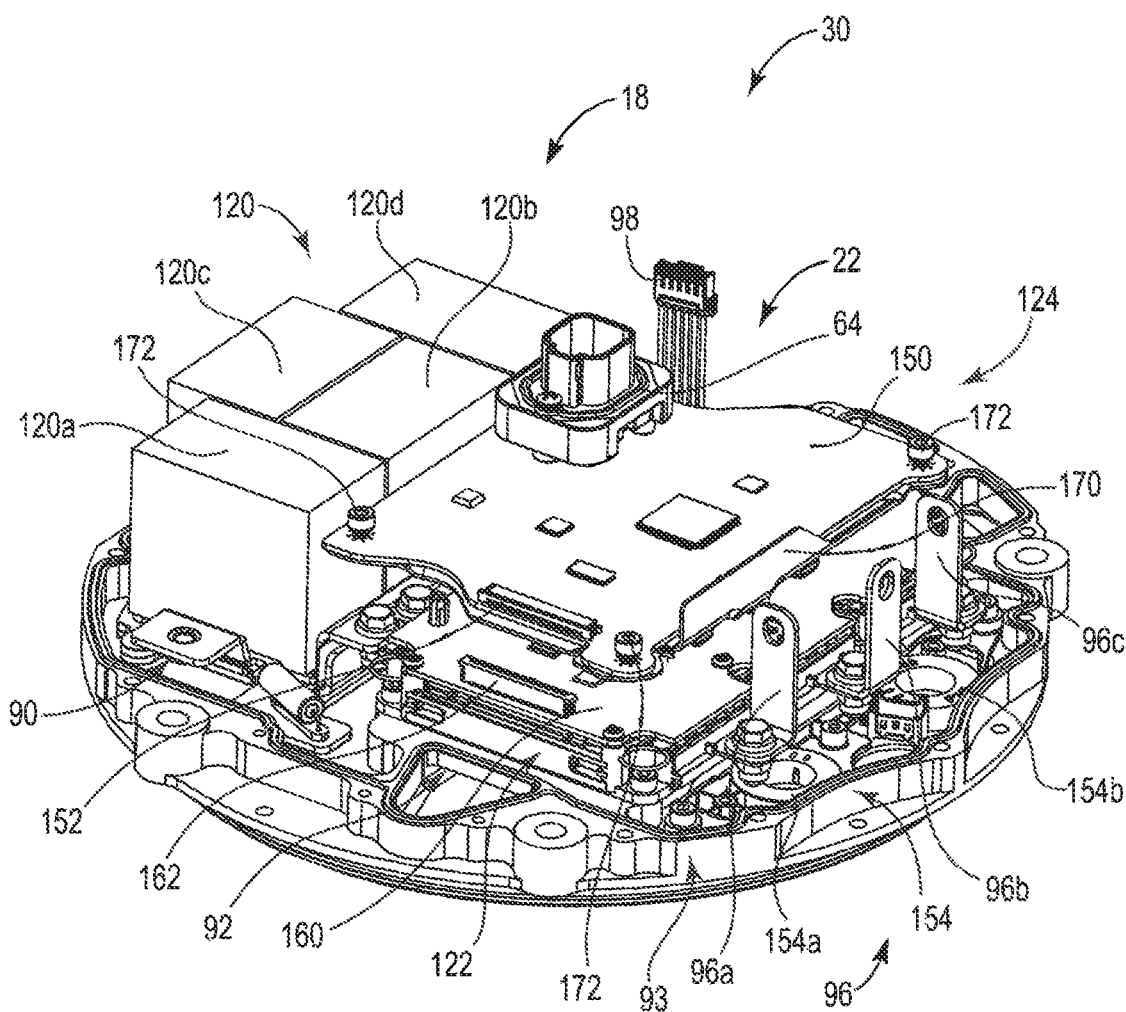
FIG. 16 is a perspective view of an inverter of a drive unit with the end cover removed, according to one example of the present disclosure.
Figure 17:
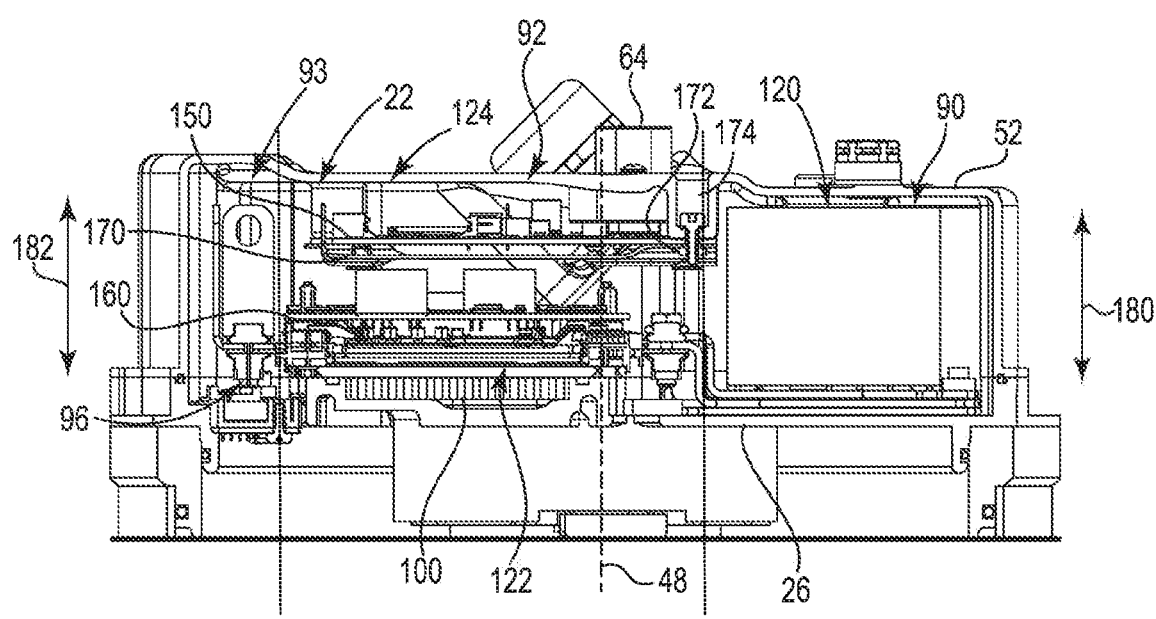
FIG. 17 is a cross-sectional view of an inverter of a drive unit, taken along a transverse axis of the drive unit, according to one example of the present disclosure.

FIG. 16 is a perspective view of inverter 18 of drive unit 30 with end cover 52 removed, according to one example of the present disclosure. FIG. 17 is a cross-sectional view of inverter 18 of drive unit 30, taken along a transverse axis of drive unit 30, according to one example of the present disclosure. FIGS. 16 and 17 illustrate a stacked arrangement of power switching network 122 and control electronics 124 along longitudinal axis 48 of drive unit 30. FIG. 17 also illustrates the delineation of first, second and third compartment portions 90, 92, 93 using dashed lines that are parallel to longitudinal axis 48. In this way, first, second and third compartment portions 90, 92, 93 might not overlap along the longitudinal direction of drive unit 30.

In some examples, power switching network 122 includes multiple electric switches to convert DC power from battery system 14 into AC power for motor 16. A non-limiting example of electrical switches are IGBT switches. The electrical switches may be housed inside of an enclosure or module to protect the electrical switches. In the illustrated example, power switching network 122 is coupled to shared wall 26 within first compartment portion 92 of first compartment 22. In some examples, power switching network 122 may be rigidly coupled to shared wall 26 using fasteners, snap-fit couplings and/or adhesives, for example. One wall of power switching network 122 may enclose and seal fluid chamber 100 in shared wall 26, which circulates fluid to cool the electrical switches.

Control electronics 124 include a motor controller 150 and a power controller 160. In the illustrated example, motor controller 150 and power controller 160 are separate components that are stacked or otherwise arranged along longitudinal axis 48. As discussed in further detail elsewhere herein, this configuration of motor controller 150 and power controller 160 may enable control electronics 124 to have a smaller overall footprint and occupy less space in first compartment 22, potentially providing a more compact form factor for drive unit 30.

The power controller 160 is electrically connected to power switching network 122 to control the electrical switches therein. For example, power controller 160 may include power electronics that control the state of the electrical switches (e.g., whether an electrical switch is open or closed) and control the timing of state changes (e.g., when an electrical switch changes from open to closed, and vice versa). In this way, power controller 160 may control, inter alia, the phase and frequency of the AC power generated by power switching network 122.

Power controller 160 may include a computer including one or more data processors and non-transitory machine-readable memory storing instructions for execution by the one or more data processors. Power controller 160 may also or instead include an application specific integrated circuit (ASIC) and/or a field programmable gate array (FPGA). In some examples, power controller 160 includes a circuit board, such as a printed circuit board, having electronics mounted thereon.

As illustrated, power controller 160 is coupled to power switching network 122 opposite shared wall 26. In some examples, power controller 160 may be rigidly coupled to power switching network 122 using fasteners, snap-fit couplings and/or adhesives, for example. In some examples, power switching network 122 includes connection pins extending parallel to longitudinal axis 48 that are received by through-holes in a circuit board of power controller 160. Solder may be used to electrically connect power controller 160 to the pins.

In some examples, motor controller 150 is or includes a motor control unit or a motor control module. Motor controller 150 is electrically connected to power controller 160 to control power controller 160. In some examples, motor controller 150 is connected to electrical connector 64 to receive control signals from other components of electric vehicle 10. Non-limiting examples of such control signals include a throttle (e.g. accelerator) signal from a throttle of electric vehicle 10, a performance mode signal indicating the performance mode set for the electric vehicle 10 (e.g., eco, performance or sport mode), and sensor data for drive unit 30 and/or other components of electric vehicle 10 (e.g., the temperature of battery pack 14). Based on one or more control signals, motor controller 150 may execute logic to determine a set of parameters for drive unit 30 (e.g., speed, torque and/or power of drive unit 30). These parameters may be communicated to power controller 160, which may control power switching network 122 to output AC power that is consistent with the parameters. Electrical connection and communication between motor controller 150 and power controller 160 may be provided by a cable (not shown) connected between motor controller 150 and power controller 160. A non-limiting example of such a cable is a flexible ribbon cable. Motor controller 150 and power controller 160 include respective connectors 152, 162 to connect to the cable.

Motor controller 150 may include a computer including one or more data processors and non-transitory machine-readable memory storing instructions for execution by the one or more data processors. Motor controller 150 may also or instead include an ASIC and/or a FPGA. In some examples, power controller 150 includes a circuit board, such as a printed circuit board, having control electronics mounted thereon.

In the illustrated example, motor controller 150 is disposed between power controller 160 and end cover 52 within second compartment portion 92. Power controller 160 is also disposed between motor controller 150 and power switching network 122. Motor controller 150 and power controller 160 may have similar dimensions (e.g., a similar length and/or width). In some examples, motor controller 150 may be rigidly coupled to power controller 160 using mounting posts and/or fasteners. However, in other examples, motor controller 150 and power controller 160 might not be rigidly coupled together (e.g., there might not be a direct mechanical connection between motor controller 150 and power controller 160). Motor controller 150 may instead be secured to, and supported by, end cover 52. Securing motor controller 150 to end cover 52 may enable control electronics 124 to be assembled more reliably as compared to when motor controller 150 is rigidly coupled to power controller 160. For example, in the case that motor controller 150 is coupled to power controller 160, variations in the dimensions of control electronics 124 (e.g., in the thickness along longitudinal axis 48) may result in there being too little room or too much room for electronical connector 64 between motor controller 160 and end cover 52. This might produce a mechanical strain on a circuit board of motor controller 150 if, for example, the circuit board deformed to compensate for the variations in dimensions. Further, coupling motor controller 150 to power controller 160 may involve the use of a support structure (e.g., mounting posts) that might not be needed to secure motor controller 150 to end cover 52. In this way, securing motor controller 150 to end cover 52 may reduce the number of components needed to assemble control electronics 124.

In the illustrated example, a plate 170 is disposed between power controller 160 and motor controller 150 to secure motor controller to end cover 52. Plate 170 may be a generally flat and rigid component made from metal, for example. The dimensions (e.g., length and width) of plate 170 may be similar to the dimensions of motor controller 150 and/or power controller 160. Plate 170 may be coupled to end cover 52 to secure motor controller 150 to the end cover 52. In the illustrated example, plate 170 is coupled to end cover 52 using fasteners 172. Fasteners 172 may be bolts that are received by through-holes 174 in end cover 52 and coupled to threaded openings in plate 170 (see fastener 172 and through-hole 174 in FIG. 17). However, other types of fasteners may also or instead be employed to couple plate 170 to end wall 52. Motor controller 150 may also define through-holes to receive fasteners 172. In some examples, plate 170, motor controller 150, end cover 52 and/or other components of inverter 18 may have alignment features to help aid the alignment of through-holes 174 with corresponding threaded openings in plate 170.

Motor controller 150 may be pressed or pinned between plate 170 and end cover 52 to secure motor controller 150 to end cover 52. Plate 170 and/or end cover 52 may also provide electrical shielding for motor controller 150. For example, housing 20 including end cover 52 may be electrically grounded. Plate 170 may be made of a conductive material (e.g., metal) and that is also grounded via conductive fasteners 172.

Figure 18:
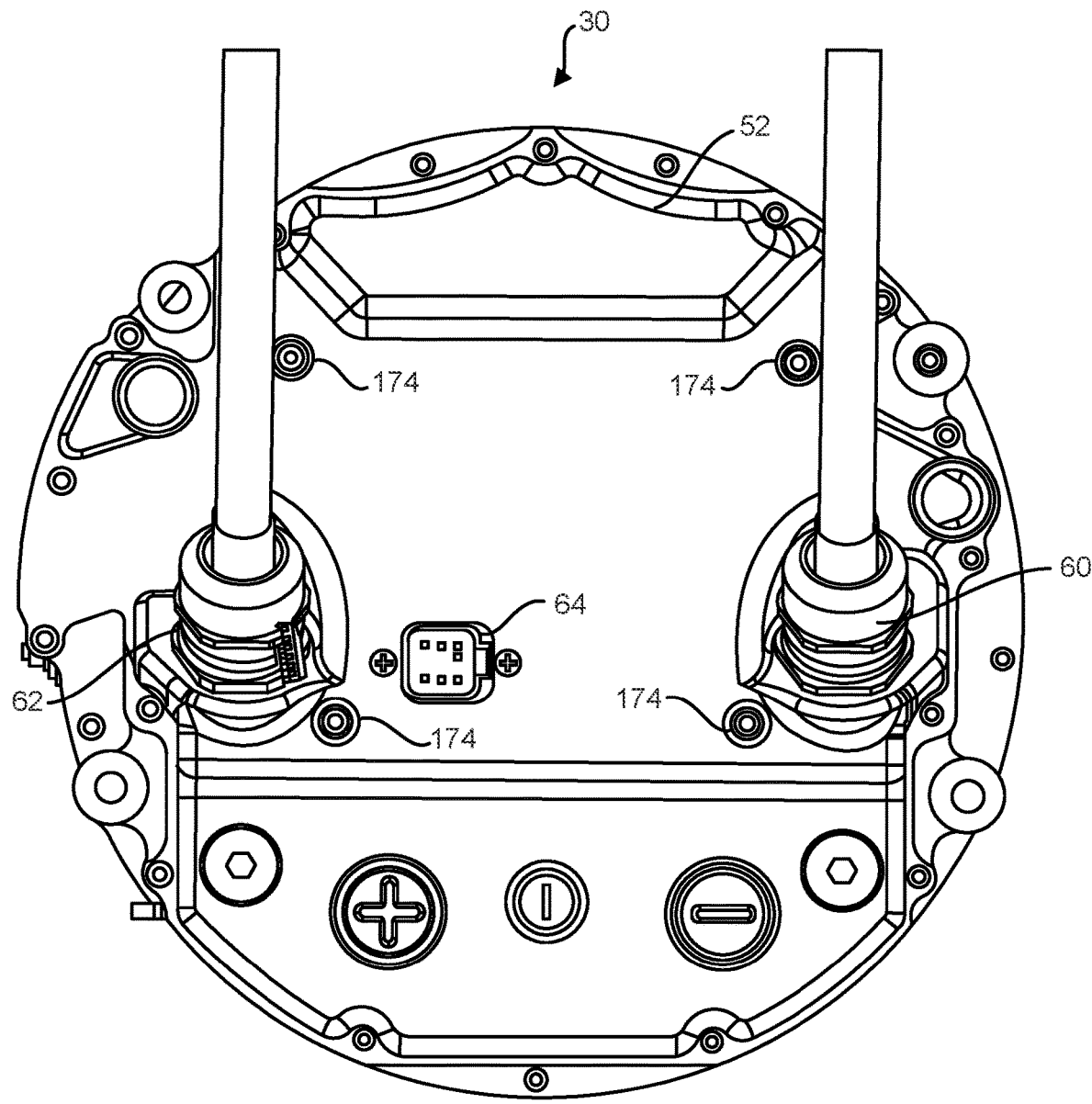
FIG. 18 is a plan view of an inverter of a drive unit, according to another example of the present disclosure.

FIG. 18 is a plan view of inverter 18 of drive unit 30 showing end cover 52, according one example of the present disclosure. FIG. 18 shows four through-holes 174 for receiving fasteners 172. Fasteners 172 may be inserted into through-holes 174 and screwed into plate 170 while end cover 52 is coupled to housing 20.

In some examples, shared wall 26, power switching network 122, power controller 160, plate 170, motor controller 150 and end cover 52 are arranged in a stack along longitudinal axis 48 of drive unit 30. The stack has a length 182 along longitudinal axis 48 within first compartment 22. Length 182 does not include the length of electrical connector 64. In some examples, length 182 may be less than, or substantially equal to, a length 180 of capacitors 120 along longitudinal axis 48. In some examples, length 180 and/or length 182 is less than 100 mm. In some examples, length 180 and/or length 182 is greater than 20 mm. In some examples, length 180 and/or length 182 is between 80 mm and 40 mm. In some examples, length 180 is between 55 and 60 mm and length 182 is between 70 and 75 mm.

Capacitors 120 may be a relatively large component of inverter 18, and might therefore provide a lower limit for the length of first compartment 22 along longitudinal axis 48. For example, the distance between shared wall 26 and end cover 52 may be based on length 180 of capacitors 120. Designing length 182 to be less than, or substantially similar to, length 180 may more efficiently utilize the interior space of first compartment 22. A length of terminals 96 may also or instead be designed to be to be less than, or substantially equal to, length 180. In some examples, capacitors 120 may define a length envelope within first compartment 22 in a direction extending along longitudinal axis 48, where both the terminals 96 and the stack formed by power switching network 122 and control electronics 124 are positioned within first compartment 22 within the length envelope.

Figure 19:
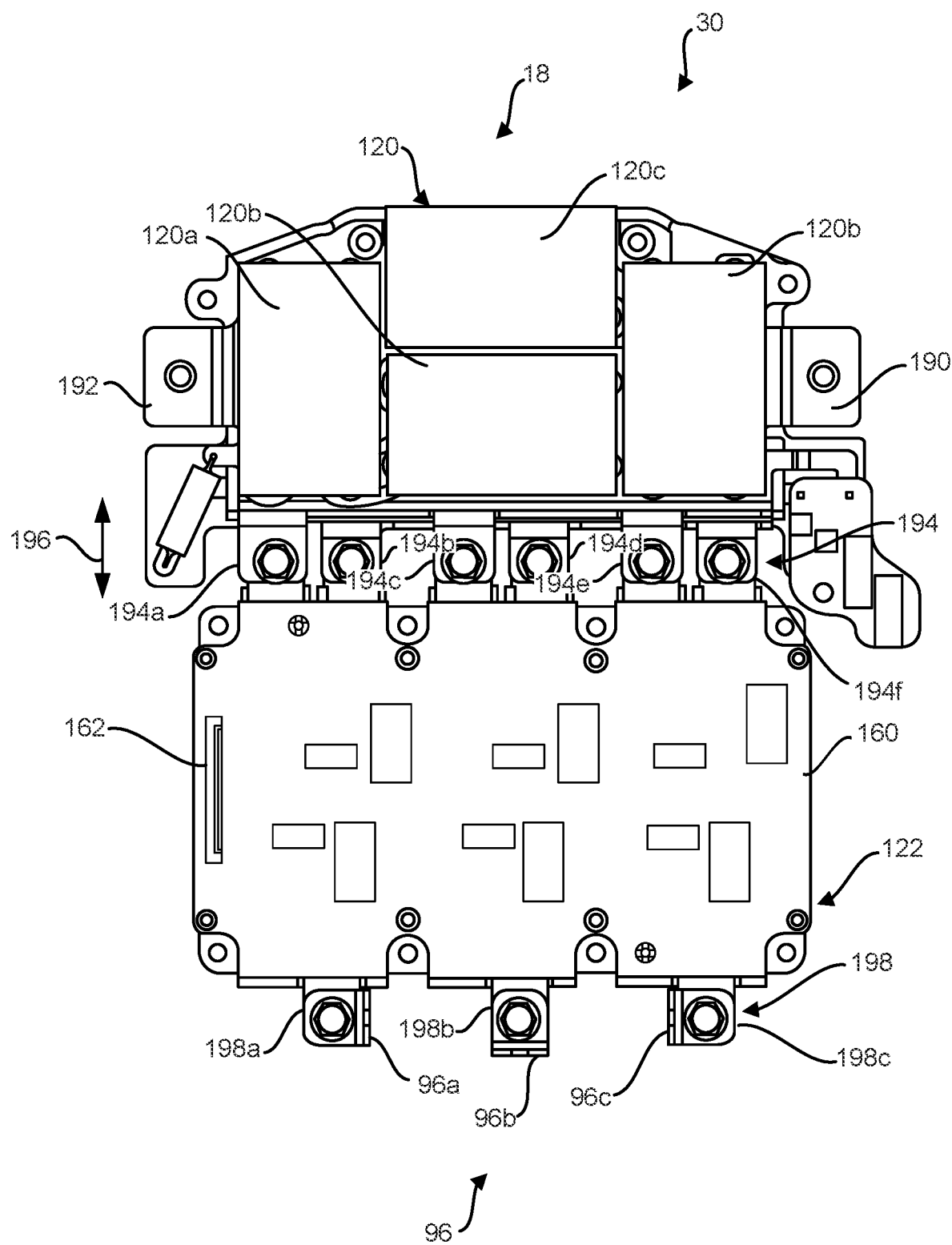
FIG. 19 is a plan view of capacitors, a power controller, a power switching network and terminals in an inverter of a drive unit, according to one example of the present disclosure.
Figure 20:
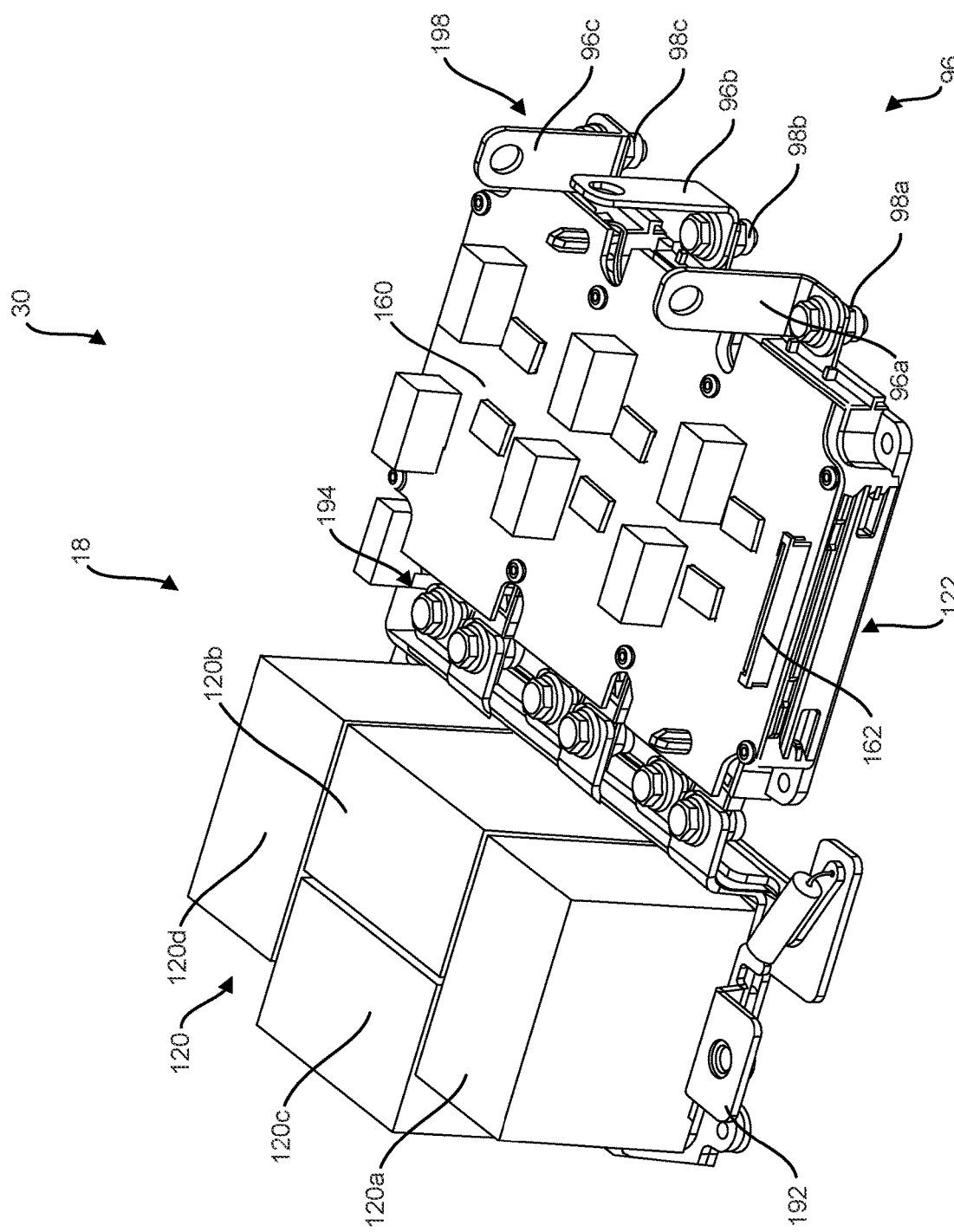
FIG. 20 is a perspective view of capacitors, a power controller, a power switching network and terminals in an inverter of a drive unit, according to one example of the present disclosure.

FIG. 19 is a plan view of capacitors 120, power controller 160, power switching network 122 and terminals 96 in inverter 18 of drive unit 30, according to one example of the present disclosure. FIG. 20 is a perspective view of capacitors 120, power controller 160, power switching network 122 and terminals 96 in inverter 18 of drive unit 30, according to one example of the present disclosure. FIGS. 19 and 20 illustrate high and low DC voltage leads 190, 192 that are connected to battery system 14 via DC connection terminals 60, 62. As discussed elsewhere herein, capacitors 120 are coupled between DC voltage leads 190, 192 to provide a low impedance path for high frequency voltage ripples produced by power switching network 122.

Six connections 194 are formed between DC voltage leads 190, 192 and power switching network 122. Connections 194a, 194b form a first pair of connections to DC voltage leads 190, 192, connections 194c, 194d form a second pair of connections to DC voltage leads 190, 192, and connections 194e, 194f form a third pair of connections to DC voltage leads 190, 192. Each pair of connections 194 between power switching network 122 and DC voltage leads 190, 192 may be used to convert DC power to AC power having a different phase. For example, the three pairs of connections 194 may each be used to generate AC power for a respective one of terminals 96. Power switching network 122 is electrically connected to terminals 96 via connections 198. Specifically, terminal 96a is connected to power switching network 122 via connection 198a, terminal 96b is connected to power switching network 122 via connection 198b, and terminal 96c is connected to power switching network 122 via connection 198c. In some examples, connections 194, 198 may include conductive tabs extending from power switching network 122 that are connected to DC voltage leads 190, 192 and/or to terminals 96 using bolts.

As discussed elsewhere herein, the arrangement of capacitors 120, power switching network 122 and terminals 96 may reduce inductance in inverter 18. By positioning capacitors 120 directly adjacent to power switching network 122, a distance 196 between capacitors 120 and power switching network 122 may be reduced. This may reduce the length and inductance of connections 194. Distance 196 may be a straight-line distance or an electrical path length between capacitors 120 and power switching network 122. As shown, distance 196 may be defined between an edge of capacitors 120 and an edge of an enclosure of power switching network 122. In other examples, distance 196 may be defined between an edge of capacitors 120 and a point of attachment (e.g., the position of a bolt or other fastener) in connections 194. In some examples, distance 196 is less than 50 mm. In some examples, distance 196 is less than 20 mm. In some examples, distance 196 is less than 10 mm. In some examples, distance 196 is approximately 15 mm.

Similarly, by positioning power switching network 122 directly adjacent to terminals 96, a distance between power switching network 122 and terminals 96 may be reduced. This may help reduce the length and the inductance of connections 198. Distance 198 may be a straight-line distance or an electrical path length between power switching network 122 to terminals 96. In some examples, the length of connections 198 is less than 50 mm. In some examples, the length of connections 198 is less than 20 mm. In some examples, the length of connections 198 is less than 10 mm. In some examples, the length of connections 198 is approximately 15 mm.

Figure 21:
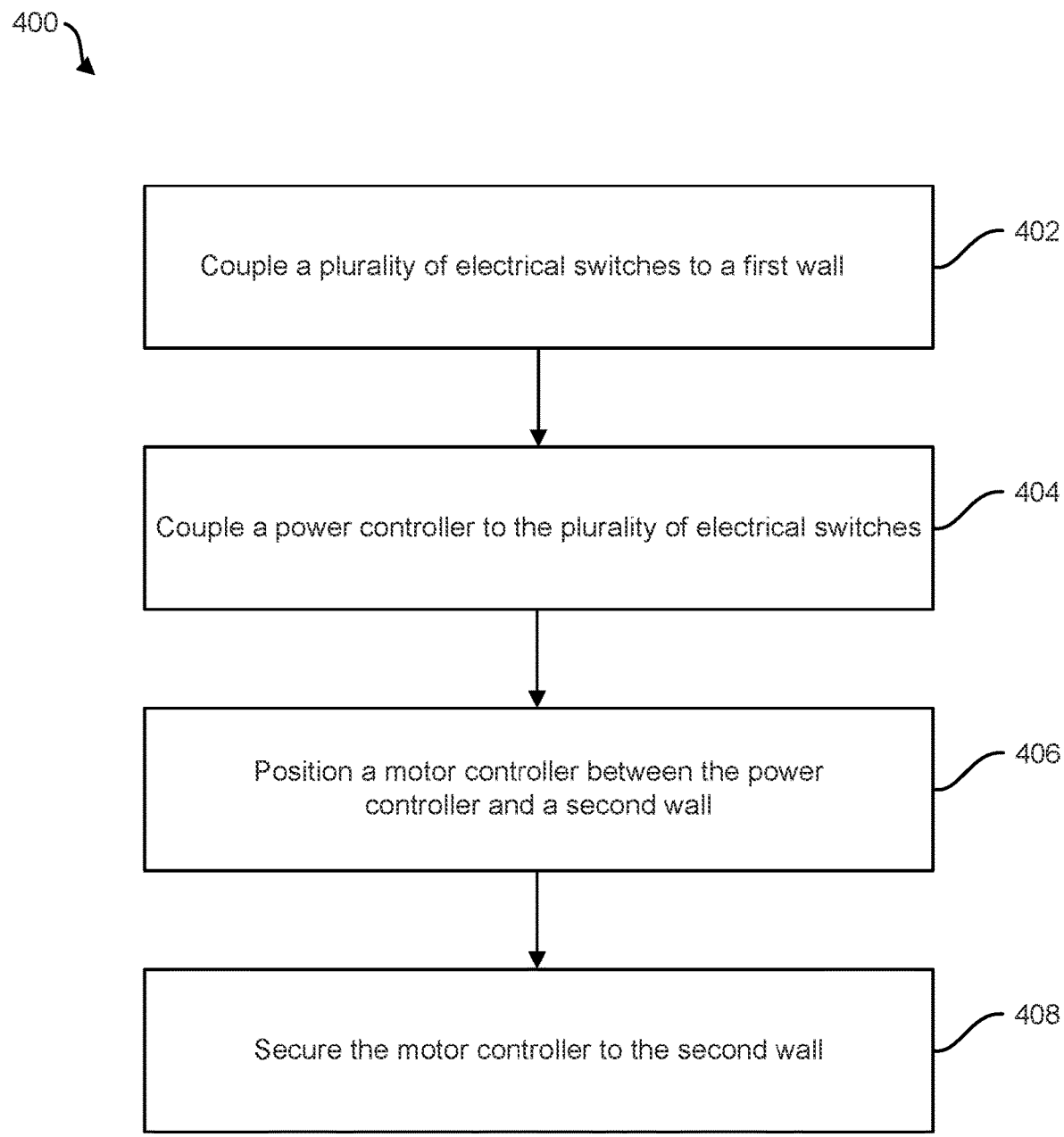
FIG. 21 is a flow diagram illustrating a method for assembling of an inverter of a drive unit, accord to one example of the present disclosure.

FIG. 21 is a flow diagram illustrating a method 400 for assembling an inverter of a drive unit, according to one example of the present disclosure. In some examples, method 400 may be implemented to assemble control electronics 124 of inverter 18. Block 402 includes coupling a plurality of electrical switches to a first wall of a housing of the inverter. For example, block 402 may include coupling power switching network 122 to shared wall 26 using fasteners and/or an adhesive. Block 404 includes coupling a power controller to the plurality of electrical switches opposite the first wall. For example, block 404 may include coupling power controller 160 to power switching network 122 opposite shared wall 26. Block 406 includes positioning a motor controller between the power controller and a second wall of the housing. For example, block 406 may include positioning motor controller 150 on top of power controller 160, optionally with plate 170 disposed between motor controller 150 and power controller 160. End cover 52 may then be installed over motor controller 150. Block 408 includes securing the motor controller to the second wall of the housing. For example, block 408 may include securing motor controller 150 to end cover 52. As discussed elsewhere herein, plate 170 may be used to secure motor controller 150 to end cover 52. Once end cover 52 is installed, fasteners 172 may be inserted into through-holes 174 in end cover 52 and coupled to plate 170. Initial alignment between through-holes 174 and corresponding threaded openings in plate 170 may be achieved by manually manipulating electrical connector 64 on motor controller 150 to achieve the alignment. Alternatively or additionally, alignment features on end cover 52, plate 170, motor controller 150, power controller 160 and/or other components of inverter 18 may be used to help achieve the alignment. Tightening fasteners 72 may force motor controller 150 against end cover 52 to secure and retain motor controller 150.

As mentioned above, drive unit 30 provides a power density greater than 5 kW/kg. In one example, the drive unit 30 provides a power density of greater than 5.5 kW/kg. In another example, the drive unit 30 provides a power density of greater than 5.75 kW/kg and in yet another example, the drive unit 30 provides a power density of greater than 6 kW/kg.

As mentioned above, the compact packaging of the motor 16, inverter 18 and housing 20, together with a stator 78a, 78b and rotor 76a, 76b construction that balances motor losses with light weight power generation, provide a drive unit 30 with performance characteristics suitable for electric powersport vehicles. Specifically, the stator 78a, 78b and rotor 76a, 76b designs shown in FIGS. 13A, 13B may provide a drive unit 30 with a maximum efficiency of greater than 97%, and in some examples of greater than 98%. In addition, the stator 78a, 78b and rotor 76a, 76b designs shown in FIGS. 13A, 13B provide a drive unit 30 with a maximum efficiency at maximum power of greater than 96%, and more particularly of greater than 97%. These high efficiency levels make the drive unit 30 suitable for use in powersport vehicles that are operated fairly continuously at, or near, their maximum power. Having a high maximum efficiency prevents harmful heat generation from causing damage to the drive unit 30.

Although specific examples have been illustrated and described herein, a variety of alternate and/or equivalent implementations may be substituted for the specific examples shown and described without departing from the scope of the present disclosure. This application is intended to cover any adaptations or variations of the specific examples discussed herein.

Example embodiments of the present disclosure will now be provided.

Example embodiment 1: A drive unit for an electric vehicle comprising:

a housing having a first compartment and a second compartment separated from one another by a shared wall; an electrical inverter disposed within the first compartment and having a set of electrical output terminals; an electric motor disposed within the second compartment and having electrical input terminals electrically coupled to the output terminals via one or more openings extending through the shared wall.

Example embodiment 2: The drive unit of example embodiment 1, the input terminals of the electric motor comprising electrical leads extending through the one or more openings into the first compartment.

Example embodiment 3: The drive unit of example embodiment 1, a perimeter of the housing being confined within a generally longitudinal form factor, the first and second compartments being disposed axially to one another along an axis of the longitudinal form factor.

Example embodiment 4: The drive unit of example embodiment 3, the longitudinal form factor being generally cylindrical in shape.

Example embodiment 5: The drive unit of example embodiment 1, the inverter including a set of solid-state switches providing electrical power to the electrical output terminals, the switches and output terminals disposed within the first compartment such that the set of output terminals axially aligns with the electrical input terminals of the electric motor to minimize conductor lengths between the electric motor and the set of solid-state switches.

Example embodiment 6: The drive unit of example embodiment 5, the electrical output terminals arrayed along an arc to axially align with the electrical input terminals.

Example embodiment 7: The drive unit of example embodiment 5, the inverter including a set of capacitors to receive DC power from a battery source, the capacitors laterally offset in a radial direction of the cylindrical form factor from the set of solid state switches.

Example embodiment 8: A drive unit housing for an electric vehicle comprising: a first housing section defining a first compartment to house an electrical inverter; and a second housing section defining a second compartment to house an electric motor, the first and second housing sections separably coupled to one another with the first and second compartments separated by a shared wall.

Example embodiment 9: The drive unit housing of example embodiment 8, the first housing section including the shared wall.

Example embodiment 10: The drive unit housing of example embodiment 8, wherein perimeters of the first and second housing sections are confined within a generally longitudinal form factor with the first and second housing sections being disposed axially to one another along an axis of the longitudinal form factor.

Example embodiment 11: The drive unit housing of example embodiment 10, the axis of the longitudinal form factor aligned with an axis of a rotor shaft of the electric motor when disposed within the second compartment.

Example embodiment 12: The drive unit housing of example embodiment 8, the first housing section including: a tubular perimeter casing defining a circumference of the first compartment and having first and second open ends; the shared wall coupled to and closing the first open end; and a cover plate separably coupled to the tubular perimeter casing to cover the second open end.

Example embodiment 13: The drive unit housing of example embodiment 12, the shared wall and the tubular perimeter casing comprising a contiguous piece.

Example embodiment 14: The drive unit housing of example embodiment 12, the cover plate including electrical terminals for connection to the inverter unit from a battery system.

Example embodiment 15: The drive unit housing of example embodiment 8, the second housing section including: a tubular perimeter casing defining a circumference of the second compartment and having first and second open ends; and a cover plate coupled to and closing the first end.

Example embodiment 16: The drive unit housing of example embodiment 15, the shared wall closing the second end when the tubular perimeter casing is coupled thereto.

Example embodiment 17: The drive unit housing of example embodiment 8, the shared wall including a bearing pocket on a side facing the second compartment to receive an end of a rotor shaft of the electric motor.

Example embodiment 18: The drive unit housing of example embodiment 8, the first compartment including a first compartment portion to house capacitors of the inverter and a second compartment portion to house power switching and control electronics of the inverter.

Example embodiment 19: The drive unit housing of example embodiment 8, the shared wall including one or more openings extending there through to provide electrical connection of the electric motor to the electrical inverter.

Example embodiment 20: The drive unit housing of example embodiment 19, wherein electrical power leads from a stator of the electric motor pass through the one or more openings from the second compartment to the first compartment.

Example embodiment 21: A drive unit housing for an electric vehicle comprising: a first housing section having perimeter sidewalls forming a first compartment to house an electrical inverter; and a second housing section having perimeter sidewalls forming a second compartment to house an electric motor, the first compartment separated from the second compartment by a shared wall, the shared wall including fluid pathways to circulate fluid to cool the electrical inverter and the perimeter sidewalls of the second housing section including fluid pathways to circulate fluid to cool the electric motor.

Example embodiment 22: The housing of example embodiment 21, the fluid pathways of the shared wall disposed in series with the fluid pathways of the perimeter sidewalls of the second housing section between a fluid inlet port and a fluid outlet port.

Example embodiment 23: The housing of example embodiment 22, the fluid pathways of the shared wall and perimeter sidewalls disposed in series with fluid pathways within a hollow rotor shaft of the electric motor disposed within the second housing section.

Example embodiment 24: The housing of example embodiment 21, a perimeter of the housing being confined within a generally longitudinal form factor, the first and second compartments being disposed axially to one another along an axis of the longitudinal form factor.

Example embodiment 25: The drive unit of example embodiment 24, the longitudinal form factor being generally cylindrical in shape.

Example embodiment 26: The drive unit of example embodiment 21, the first housing section including the shared wall.

Example embodiment 27: The drive unit of example embodiment 21, the first housing section separable from the second housing section.

Example embodiment 28: A drive unit for an electric vehicle comprising: a housing including: a first housing section having perimeter sidewalls forming a first compartment; and a second housing section having a perimeter sidewalls forming a second compartment, the first and second compartments separated from one another by a shared wall; an electrical inverter disposed within the first compartment, the electrical inverter including inverter components mounted to the shared wall; and an electric motor disposed within the second compartment, the shared wall including fluid pathways to circulate fluid to cool the electrical inverter and the perimeter sidewalls of the second housing section including fluid pathways to circulate fluid to cool the electric motor.

Example embodiment 29: The drive unit of example embodiment 28, the electric motor including a hollow rotor shaft having an inlet fluid pathway and an outlet fluid pathway to circulate fluid through the shaft to cool the electric motor, an end of the rotor shaft disposed within a bearing pocket on the shared wall, the inlet and outlet fluid pathways in fluidic communication with fluid pathways of the shared sidewall via the end of the rotor shaft.

Example embodiment 30: The drive unit of example embodiment 29, the fluid pathways of the shared wall, the inlet and output fluid pathways of the rotor shaft, and the fluid pathways of the perimeter sidewalls of the second housing section form a continuous fluid pathway between a fluid inlet port and a fluid outlet port.

Example embodiment 31: The drive unit of example embodiment 30, the electrical inverter including a set of capacitors mounted to the shared wall, the fluid pathways arranged so as to first pass the capacitors downstream of the fluid inlet port.

Example embodiment 32: The drive unit of example embodiment 27, the perimeter sidewalls of the second housing section including a cylindrical housing extending about a perimeter of a stator section of the electric motor, the fluid pathways extending about a circumference of the cylindrical housing.

Example embodiment 33: The drive unit of example embodiment 32, the fluid pathways extending in a spiral fashion about the circumference of the cylindrical housing.

Example embodiment 34: The drive unit of example embodiment 28, a perimeter of the housing being confined within a generally longitudinal form factor, the first and second compartments being disposed axially to one another along an axis of the longitudinal form factor.

Example embodiment 35: The drive unit of example embodiment 34, the longitudinal form factor being generally cylindrical in shape.

Example embodiment 36: A drive unit housing for an electric vehicle comprising: a first housing section having perimeter sidewalls forming a first compartment to house an electrical inverter; and a second housing section having perimeter sidewalls forming a second compartment to house an electric motor, the first compartment separated from the second compartment by a shared wall, the first and second housing sections having perimeters confined within a generally longitudinal form factor and being disposed axially to one another along an axis of the longitudinal form factor; and a continuous fluid pathway extending through the first and second housing sections between an inlet and an outlet port to circulate fluid to cool the electrical inverter and the electric motor.

Example embodiment 37: The drive unit housing of example embodiment 36, the continuous fluid pathway including a portion disposed in the shared sidewall.

Example embodiment 38: The drive unit housing of example embodiment 36, the continuous fluid pathway in series with a fluid pathway within a hollow rotor shaft of the electric motor.

Example embodiment 39: The drive unit housing of example embodiment 38, the continuous fluid pathway in fluid communication with the fluid pathway within the hollow rotor shaft via a portion of the fluid pathway disposed within the shared wall.

Example embodiment 40: The drive unit of example embodiment 36, the continuous fluid pathway including a spiral pathway disposed about a perimeter of the second housing section to cool the electric motor.

The invention claimed is:
1. A power inverter of an electric drive unit, the power inverter comprising:
   a housing comprising a compartment at least partially formed by a first wall and an opposing second wall;
   a plurality of electrical switches to convert direct current (DC) power into alternating current (AC) power, the plurality of electrical switches coupled to the first wall within the compartment;
   a power controller to control the plurality of electrical switches, the power controller coupled to the plurality of electrical switches; and
   a motor controller to control the power controller, the motor controller disposed between the power controller and the second wall.
2. The power inverter of claim 1, wherein the power controller is disposed between the plurality of electrical switches and the motor controller.
3. The power inverter of claim 1, wherein the motor controller is secured to the second wall.
4. The power inverter of claim 3, comprising a plate disposed between the power controller and the motor controller, the plate being coupled to the second wall to secure the motor controller to the second wall.
5. The power inverter of claim 4, wherein the plate is coupled to the second wall via fasteners.
6. The power inverter of claim 5, wherein the fasteners comprise bolts, the second wall comprises through-holes to receive the bolts, and the plate comprises threaded openings to couple to the bolts.
7. The power inverter of claim 4, wherein the plate is electrically grounded to electrically shield the motor controller.
8. The power inverter of claim 1, wherein the first wall, the plurality of switches, the power controller, the motor controller and the second wall are arranged in a stack along a longitudinal axis of the housing.
9. The power inverter of claim 8, further comprising a capacitor disposed in the compartment.
10. The power inverter of claim 9, wherein:
    the capacitor has a first length along the longitudinal axis of the housing;
    the stack has a second length along the longitudinal axis of the housing; and
    the second length is less than or substantially equal to the first length.
11. The power inverter of claim 1, wherein the power controller comprises a first circuit board and the motor controller comprises a second circuit board.
12. The power inverter of claim 1, wherein the first wall comprises a fluid chamber to cool the plurality of electrical switches.
13. The power inverter of claim 1, wherein the second wall is a removeable cover of the housing.
14. The power inverter of claim 1, wherein the plurality of electric switches convert the DC power into three-phase AC power.
15. The power inverter of claim 1, comprising an electrical connector to connect to the motor controller to carry control signals to the motor controller.
16. The power inverter of claim 15, wherein the electric drive unit is implemented in an electric vehicle and the electrical connector is to carry throttle signals to the motor controller.
17. The power inverter of claim 1, comprising a cable connected between the power controller and the motor controller to provide communication between the power controller and the motor controller.
18. The power inverter of claim 1, wherein the first wall is a shared wall separating the compartment from an electric motor of the drive unit.
19. A power inverter of an electric drive unit, the power inverter comprising:
    a housing comprising a compartment at least partially formed by a first wall and an opposing second wall, the compartment having a first portion, a second portion and a third portion, the second portion being adjacent to the first portion and to the third portion;
    at least one capacitor connected between positive and negative leads of a direct current (DC) power supply, the at least one capacitor disposed within the first portion of the compartment;
    a plurality of electrical switches disposed within the second portion of the compartment, the plurality of electrical switches connected to the positive and negative leads of the DC power supply to convert DC power to AC power; and
    a plurality of terminals connected to the plurality of electrical switches to transfer the AC power to an electric motor of the electric drive unit, the plurality of terminals disposed within the third portion of the housing.
20. The power inverter of claim 19, wherein the second portion is disposed between the first portion and the second portion.
21. The power inverter of claim 20, wherein the first portion, the second portion and the third portion of the compartment are arranged along a transverse axis of the housing.
22. The power inverter of claim 19, comprising a current sensor to measure electric current in one of the plurality of terminals, the current sensor disposed in the third portion of the housing and coupled to the first wall.
23. A method of assembly for a power inverter of an electric drive unit, the method comprising:
    coupling a plurality of electrical switches to a first wall of a housing of the power inverter, the plurality of electrical switches to convert direct current (DC) power into alternating current (AC) power;
    coupling a power controller to the plurality of electrical switches opposite the first wall, the power controller to control the plurality of electrical switches;
    positioning a motor controller between the power controller and a second wall of the housing, the motor controller to control the power controller; and
    securing the motor controller to the second wall of the housing.

* * * * *